(12) United States Patent
Zhamu et al.

(10) Patent No.: US 9,979,060 B2
(45) Date of Patent: *May 22, 2018

(54) FLEXIBLE ASYMMETRIC ELECTROCHEMICAL CELLS USING NANO GRAPHENE PLATELET AS AN ELECTRODE MATERIAL

(71) Applicant: Nanotek Instruments, Inc., Dayton, OH (US)

(72) Inventors: Aruna Zhamu, Springboro, OH (US); Bor Z. Jang, Centerville, OH (US)

(73) Assignee: Nanotek Instruments, Inc., Dayton, OH (US)

( * ) Notice: Subject to any disclaimer, the term of this patent is extended or adjusted under 35 U.S.C. 154(b) by 18 days.

This patent is subject to a terminal disclaimer.

(21) Appl. No.: 15/463,531

(22) Filed: Mar. 20, 2017

(65) Prior Publication Data

US 2017/0200996 A1    Jul. 13, 2017

Related U.S. Application Data

(62) Division of application No. 12/657,579, filed on Jan. 25, 2010, now Pat. No. 9,640,334.

(51) Int. Cl.
   *H01M 12/00*     (2006.01)
   *H01M 16/00*     (2006.01)
   (Continued)

(52) U.S. Cl.
   CPC ......... *H01M 16/003* (2013.01); *H01G 11/26* (2013.01); *H01G 11/36* (2013.01);
   (Continued)

(58) Field of Classification Search
   CPC .... H01M 16/003; H01M 4/382; H01M 4/587; H01M 12/005; H01M 2300/0045;
   (Continued)

(56) References Cited

U.S. PATENT DOCUMENTS

| 2,798,878 A | 7/1957 | Hummers |
| 6,222,723 B1 * | 4/2001 | Razoumov ............ H01G 9/155 361/502 |

(Continued)

OTHER PUBLICATIONS

Peng et al. "Unequalisation of electrode capacitances for enhanced energy capacity in asymmetrical supercapacitors." Energy Environ. Sci. 2010, 3, 1499-1502, accepted Aug. 2010.*

(Continued)

*Primary Examiner* — Michael L Dignan

(57) ABSTRACT

A flexible, asymmetric electrochemical cell comprising: (A) A sheet of graphene paper as first electrode comprising nano graphene platelets having a platelet thickness less than 1 nm, wherein the first electrode has electrolyte-accessible pores; (B) A thin-film or paper-like first separator and electrolyte; and (C) A thin-film or paper-like second electrode which is different in composition than the first electrode; wherein the separator is sandwiched between the first and second electrode to form a flexible laminate configuration. The asymmetric supercapacitor cells with different NGP-based electrodes exhibit an exceptionally high capacitance, specific energy, and stable and long cycle life.

9 Claims, 10 Drawing Sheets

(51) Int. Cl.
*H01G 11/36* (2013.01)
*H01G 11/26* (2013.01)
*H01G 11/52* (2013.01)
*H01L 31/0224* (2006.01)
*H01L 51/00* (2006.01)
*H01M 4/38* (2006.01)
*H01M 4/587* (2010.01)

(52) U.S. Cl.
CPC ..... *H01G 11/52* (2013.01); *H01L 31/022425* (2013.01); *H01L 51/0048* (2013.01); *H01M 4/382* (2013.01); *H01M 4/587* (2013.01); *H01M 12/005* (2013.01); *H01M 2300/0045* (2013.01)

(58) Field of Classification Search
CPC ........ H01G 11/36; H01G 11/26; H01G 11/52; H01L 51/0048
See application file for complete search history.

(56) References Cited

U.S. PATENT DOCUMENTS

| | | | |
|---|---|---|---|
| 7,623,340 | B1 | 11/2009 | Song et al. |
| 9,640,334 | B2* | 5/2017 | Yu .................... H01G 11/36 |
| 2003/0130114 | A1 | 7/2003 | Hampden-Smith et al. |
| 2005/0244644 | A1* | 11/2005 | Hampden-Smith .. B01J 31/1625 428/408 |
| 2007/0158618 | A1 | 7/2007 | Song et al. |
| 2008/0232028 | A1 | 9/2008 | Zhao |
| 2008/0279756 | A1 | 11/2008 | Zhamu et al. |
| 2009/0022649 | A1 | 1/2009 | Zhamu et al. |
| 2009/0059474 | A1 | 3/2009 | Zhamu et al. |
| 2009/0061312 | A1 | 3/2009 | Zhamu et al. |
| 2009/0092747 | A1 | 4/2009 | Zhamu et al. |
| 2009/0290287 | A1* | 11/2009 | Lipka .................... H01G 11/46 361/502 |
| 2010/0021819 | A1 | 1/2010 | Zhamu et al. |

OTHER PUBLICATIONS

S. R. Vivekchand, et al., "Graphene-based Electrochemical Supercapacitor," J. Chem Sci., vol. 120 (Jan. 2008) pp. 9-13.

M. D. Stoller, et al, "Graphene-based Ultracapacitor," Nano Letters, Vo. 8 (2008) pp. 3498-3502.

X. Zhao, "Carbon Nanosheets as the Electrode Material in Supercapacitors," J. of Power Sources, 194 (2009) 1208-1212.

Y. Wang, "Supercapacitor Devices Based on Graphene Materials," J. Phys. Chem., C. 113 (2009) 13103-13107.

H. Wang, et al., "Graphene Oxide Doped Polyaniline for Supercapacitors," Electrochem. Communications, 11 (2009) 1158-1161.

Y. P. Zhang, et al. "Capacitive Behavior of Graphene-ZnO Composite Film for Supercapacitors," J. Electroanalytical Chem., 634 (2009) 68-71.

D. W. Wang, et al. "Fabrication of Graphene/Polyaniline Composite Paper via in-situ Anodic Electropolymerization for High-Performance of Flexible Electrode," ACS Nano, 3 (2009) 1745-1752.

V. L. Pushparaj, et al. "Flexible Energy Storage Device Based on Nanocomposite Paper," Proceedings of National Academy of Science (PNAS), 104 (Aug. 21, 2007) 13574-13577.

A. L. M. Reddy, et al, "Asymmetric flexible supercapacitor stack," Nanoscale Res. Lett. 3 (2008) 145-151.

Peng et al. "Unequalization of electrode capacitances for enhanced energy capacity in asymmetrical supercapacitors." Energy Environ. Sci. 2010, 3, 1499-1502.

* cited by examiner

US 9,979,060 B2

FLEXIBLE ASYMMETRIC ELECTROCHEMICAL CELLS USING NANO GRAPHENE PLATELET AS AN ELECTRODE MATERIAL

CROSS REFERENCE TO RELATED APPLICATIONS

The present application is a divisional application of U.S. patent application Ser. No. 12/657,579, now U.S. Pat. No. 9,640,334 (May 2, 2017), entitled "Flexible Asymmetric Electrochemical Cells Using Nano Graphene Platelet as an Electrode Material", filed on Jan. 25, 2010, the contents of which are incorporated by reference herein, in their entirety, for all purposes.

STATEMENT REGARDING FEDERALLY SPONSORED RESEARCH OR DEVELOPMENT

This invention is based on the results of a research project sponsored by the US DOE SBIR Program. The US government has certain rights on this invention.

FIELD OF THE INVENTION

The present invention relates generally to the field of supercapacitor, ultracapacitor, or electrochemical capacitor electrodes. In particular, the invention is related to nano graphene platelet-based electrodes for supercapacitors or supercapacitor-battery hybrid electro-chemical cells.

BACKGROUND OF THE INVENTION

Electrochemical capacitors (ECs), also known as ultracapacitors or supercapacitors, are being considered for uses in hybrid electric vehicles (EVs) where they can supplement a battery used in an electric car to provide bursts of power needed for rapid acceleration. A seamless integration of a cost-effective lithium ion battery and a low-cost high-energy density supercapacitor is the biggest technical hurdle to making battery-powered cars commercially viable. A battery is used for cruising, but a supercapacitor (with its ability to release energy much more quickly than a battery) would kick in whenever the car needs to accelerate for merging, passing, emergency maneuvers, and hill climbing. The EC must also store sufficient energy to provide an acceptable driving range. To be cost- and weight-effective compared to additional battery capacity they must combine adequate specific energy and specific power with a long cycle life, and meet cost targets as well. Specifically, it must store about 400 Wh of energy, be able to deliver about 40 kW of power for about 10 seconds, and provide high cycle-life (>100,000 cycles).

ECs are also gaining acceptance in the electronics industry as system designers become familiar with their attributes and benefits. ECs were originally developed to provide large bursts of driving energy for orbital lasers. In complementary metal oxide semiconductor (CMOS) memory backup applications, for instance, a one-Farad EC having a volume of only one-half cubic inch can replace nickel-cadmium or lithium batteries and provide backup power for months. For a given applied voltage, the stored energy in an EC associated with a given charge is half that storable in a corresponding battery system for passage of the same charge. Nevertheless, ECs are extremely attractive power sources. Compared with batteries, they require no maintenance, offer much higher cycle-life, require a very simple charging circuit, experience no "memory effect," and are generally much safer. Physical rather than chemical energy storage is the key reason for their safe operation and extraordinarily high cycle-life. Perhaps most importantly, supercapacitors offer higher power density and much shorter charge time than batteries.

The high volumetric capacitance density of an EC (10 to 100 times greater than conventional capacitors) derives from using porous electrodes to create a large effective "plate area" and from storing energy in diffuse double layers. This double layer, created naturally at a solid-electrolyte interface when voltage is imposed, has a thickness of only about 1 nm, thus forming an extremely small effective "plate separation." In some ECs, stored energy is further augmented by pseudo-capacitance effects, occurring again at the solid-electrolyte interface due to electrochemical phenomena, such as the redox charge transfer. The double layer capacitor is based on a high surface area electrode material, such as activated carbon, immersed in an electrolyte. A polarized double layer is formed at electrode-electrolyte interfaces providing high capacitance. This implies that the specific capacitance of a supercapacitor is directly proportional to the specific surface area of the electrode material. This surface area must be accessible by electrolyte and the resulting interfacial zones must be sufficiently large to accommodate the so-called double-layer charges.

Experience with ECs based on activated carbon electrodes shows that the experimentally measured capacitance is always much lower than the geometrical capacitance calculated from the measured surface area and the width of the dipole layer. For very high surface area carbons, typically only about ten percent of the "theoretical" capacitance was observed. This disappointing performance is due to the presence of micro-pores that are not accessible by the electrolyte, wetting deficiencies, and/or the inability of a double layer to form successfully in pores in which the oppositely charged surfaces are less than about 2 nm apart. In activated carbons, depending on the source of the carbon and the heat treatment temperature, a surprising amount of surface can be in the form of such micro-pores.

It would be desirable to produce an EC that exhibits greater geometrical capacitance using a carbon based electrode having a high electrolyte-accessible surface area, high porosity, and reduced or no micro-pores. It would be further advantageous to develop carbon-based nano-structures that are conducive to the occurrence of pseudo-capacitance effects, such as the redox charge transfer.

Carbon nanotubes (CNT) are nanometer-scale sized tube-shaped molecules having the structure of a graphite molecule rolled into a rube. A nanotube can be single-walled or multi-walled, dependent upon conditions of preparation. Carbon nanotubes typically are electrically conductive and mechanically strong and stiff along their length. CNTs are being studied for electrochemical supercapacitor electrodes due to their unique properties and structure, which include high specific surface area (e.g. up to 1,300 $m^2/g$), high conductivity, and chemical stability. Capacitance values from 20 to 180 F/g have been reported, depending on CNT purity and electrolyte, as well as on specimen treatment such as $CO_2$ physical activation, KOH chemical activation, or exposure to nitric acid, fluorine, or ammonia plasma. Conducting polymers, such as polyacetylene, polypyrrole, polyaniline, polythiophene, and their derivatives, are also common electrode materials for supercapacitors. The modification of CNTs with conducting polymers is one way to increase the capacitance of the composite resulting from redox contribution of the conducting polymers. In the CNT/ conducting polymer composite, CNTs are electron acceptors while the conducting polymer serves as an electron donor. A charge transfer complex is formed between CNTs in their ground state and aniline monomer. A number of studies on CNT/conducting polymer composites for electrochemical capacitor applications have been reported.

However, there are several drawbacks associated with carbon nanotube-filled composites. First, CNTs are known to be extremely expensive due to the low yield, low production rate, and low purification rate commonly associated with the current CNT preparation processes. The high material costs have significantly hindered the widespread application of CNTs. Second, CNTs tend to form a tangled mess resembling a hairball, which is difficult to work with (e.g., difficult to disperse in a liquid solvent or resin matrix). This and other difficulties have significantly limited the scope of application of CNTs.

Instead of trying to develop much lower-cost processes for making CNTs, researchers at Nanotek Instruments, Inc. have worked diligently to develop alternative nano-scaled carbon materials that exhibit comparable properties and can be mass-produced at much lower costs. This development work has led to the discovery of processes for producing individual nano-scaled graphite planes (individual single-layer graphene sheets) and stacks of multiple graphene sheets, which are collectively called nano graphene platelets (NGPs). A single-layer graphene sheet is basically a 2-D hexagon lattice of $sp^2$ carbon atoms covalently bonded along two plane directions. The sheet is essentially one carbon atom thick, which is smaller than 0.34 nm. The structures of NGPs may be best visualized by making a longitudinal scission on the single-wall or multi-wall of a nano-tube along its tube axis direction and then flattening up the structure to form a single-layer or multi-layer graphene platelet. In practice, NGPs are obtained from a precursor material, such as graphite particles, using a low-cost process, but not via flattening of CNTs. These nano materials are cost-effective substitutes for CNTs or other types of nano-rods for various scientific and engineering applications.

Nano graphene materials have recently been found to exhibit exceptionally high thermal conductivity, high electrical conductivity, and high strength. As a matter of fact, single-layer graphene exhibits the highest thermal conductivity and highest intrinsic strength of all currently known materials. Another outstanding characteristic of graphene is its exceptionally high specific surface area. A single graphene sheet provides a specific external surface area of approximately 2,675 $m^2/g$ (that is accessible by liquid electrolyte), as opposed to the exterior surface area of approximately 1,300 $m^2/g$ provided by a corresponding single-wall CNT (interior surface not accessible by electrolyte). The electrical conductivity of graphene is slightly higher than that of CNTs.

Two of the instant applicants (A. Zhamu and B. Z. Jang) and their colleagues were the first to investigate NGP- and other nano graphite-based nano materials for supercapacitor application [Please see Refs. 1-5 below; the 1$^{st}$ patent application was submitted in 2006 and issued in 2009]. After 2007, other researchers began to realize the significance of nano graphene materials for supercapacitor applications [Refs. 6-12].

LIST OF REFERENCES

1. Lulu Song, A. Zhamu, Jiusheng Guo, and B. Z. Jang "Nano-scaled Graphene Plate Nanocomposites for Supercapacitor Electrodes" U.S. Pat. No. 7,623,340 (Nov. 24, 2009).
2. Aruna Zhamu and Bor Z. Jang, "Process for Producing Nano-scaled Graphene Platelet Nanocomposite Electrodes for Supercapacitors," U.S. patent application Ser. No. 11/906,786 (Oct. 4, 2007).
3. Aruna Zhamu and Bor Z. Jang, "Graphite-Carbon Composite Electrodes for Supercapacitors" U.S. patent application Ser. No. 11/895,657 (Aug. 27, 2007).
4. Aruna Zhamu and Bor Z. Jang, "Method of Producing Graphite-Carbon Composite Electrodes for Supercapacitors" U.S. patent application Ser. No. 11/895,588 (Aug. 27, 2007).
5. Aruna Zhamu and Bor Z. Jang, "Graphene Nanocomposites for Electrochemical cell Electrodes," U.S. patent application Ser. No. 12/220,651 (Jul. 28, 2008).
6. S. R. Vivekchand, et al., "Graphene-based Electrochemical Supercapacitor," J. Chem Sci., Vol. 120 (January 2008) pp. 9-13.
7. M. D. Stoller, et al, "Graphene-based Ultracapacitor," Nano Letters, Vo. 8 (2008) pp. 3498-3502.
8. X. Zhao, "Carbon Nanosheets as the Electrode Material in Supercapacitors," J. of Power Sources," 194 (2009) 1208-1212.
9. X. Zhao, "Supercapacitors Using Carbon Nanosheets as Electrode," US Pat. Pub. No. 2008/0232028 (Sep. 25, 2008).
10. Y. Wang, "Supercapacitor Devices Based on Graphene Materials," J. Phys. Chem., C. 113 (2009) 13103-13107.
11. H. Wang, et al., "Graphene Oxide Doped Polyaniline for Supercapacitors," Electrochem. Communications, 11 (2009) 1158-1161.
12. Y. P. Zhang, et al. "Capacitive Behavior of Graphene-ZnO Composite Film for Supercapacitors," J. Electroanalytical Chem., 634 (2009) 68-71.
13. D. W. Wang, et al. "Fabrication of Graphene/Polyaniline Composite Paper via in-situ Anodic Electropolymerization for High-Performance of Flexible Electrode," ACS Nano, 3 (2009) 1745-1752.
14. V. L. Pushparaj, et al. "Flexible Energy Storage Device Based on Nanocomposite Paper," Proceedings of National Academy of Science (PNAS), 104 (Aug. 21, 2007) 13574-13577.
15. A. L. M. Reddy, et al, "Asymmetric flexible supercapacitor stack," Nanoscale Res. Lett. 3 (2008) 145-151.

All prior art work on nano graphene-based supercapacitor failed to recognize the significance of either an asymmetric supercapacitor configuration or a graphene-based flexible laminate supercapacitor assembly. As will be herein demonstrated, the asymmetric supercapacitor design furthers improves the supercapacitor performance and the flexible assembly enables more versatile and flexible supercapacitor designs. This has been overlooked by prior art workers. This was despite the notion that the applicants' research group [Ref. 1] and others [Ref. 15] have investigated nano graphene paper-based supercapacitor and that flexible energy storage devices based on CNT nanocomposite paper was reported by Pushparaj, et al [Ref. 14] and asymmetric flexible supercapacitor based on CNTs was reported by A. Reddy et al [Ref. 15]. Further, the significance of integrating a nano graphene-based supercapacitor element and a lithium battery element to make a hybrid energy storage cell has also gone un-noticed by prior art workers.

Thus, it is an object of the present invention to provide a flexible, asymmetric supercapacitor containing at least one electrode that features stacked nano graphene platelets (NGPs) with a packing arrangement effective for achieving a high electrode surface area. The specific surface area is preferably and typically greater than 100 $m^2/gm$ (more typically greater than 200 m$^2$/gm, some greater than 500 m$^2$/gm, and even greater than 1000 m$^2$/gm). The NGP-based electrode and, preferably, all other electrode and electrolyte (separator) layers are in a thin film or paper form so that the resulting multi-layer supercapacitor configuration is mechanically flexible.

It is another object of the present invention to provide a supercapacitor that has a cell-level energy density greater than 10 Wh/kg, as opposed to the energy density range of 3-6 Wh/kg of currently available supercapacitors. The electric vehicle industry and the US Department of Energy are pushing the energy storage suppliers to achieve a supercapacitor with a cell-level energy density of 10 Wh/kg.

SUMMARY OF THE INVENTION

The present invention provides a flexible, asymmetric electrochemical cell comprising: (A) A sheet of graphene paper as first electrode comprising nano graphene platelets having a platelet thickness less than 1 nm, wherein this first electrode has electrolyte-accessible pores; (B) A thin-film or paper-like first separator and electrolyte (e.g. porous paper or polymer film with electrolyte permeating into pores of the separator); (C) A thin-film or paper-like second electrode which is different in composition than the first electrode; and wherein the separator is sandwiched between the first and second electrode to form a flexible laminate configuration. Preferably, at least one of the electrodes and separator is thinner than 1 mm, more preferably thinner than 0.1 mm or 100 μm. Most preferably, all electrode and separator layers are thinner than 100 μm.

In a preferred embodiment of the present invention, the second electrode also comprises nano graphene platelets having a platelet thickness no greater than 1 nm and the electrode has electrolyte-accessible pores. There is no restriction on the type of electrolyte, but preferably it is not aqueous-based. Further preferably, the electrolyte comprises a room temperature ionic liquid. The electrochemical cell can be an asymmetric supercapacitor or a supercapacitor-lithium battery hybrid cell. When used as a battery or hybrid cell, the second electrode comprises a lithium foil or lithium-intercalated material.

Any one of the electrodes may further comprise fibrous elements selected from the group consisting of carbon nano-fibers, graphitic nano-fibers, carbon nano-tubes, carbon-graphite fibers, cellulose fibers, glass fibers, polymer fibers, ceramic fibers, metal fibers, and combinations thereof.

In one preferred embodiment, the first electrode further comprises a binder material that bonds graphene platelets together to form a cohered nanocomposite layer. In another embodiment, both the first and second electrodes comprise a binder material. The binder material may comprise a conductive material selected from the group consisting of a conducting polymer, a polymeric carbon, an amorphous carbon, a petroleum pitch or its derivative, a coal tar pitch or its derivative, a meso-phase pitch, and combinations thereof. In a further embodiment of the present invention, the graphene platelets are activated or surface-functionalized, e.g., with one or more transition metal oxides, carbides, or sulfides, or with an intrinsically conductive polymer, such as polyaniline, polypyrrole, and polythiophene.

Another preferred embodiment of the present invention is a flexible electrochemical capacitor or supercapacitor, comprising: (A) a first paper-like electrode, comprising nano graphene platelets and a plurality of pores accessible by a liquid electrolyte wherein the first electrode has a specific surface area greater than about 100 m$^2$/gm; (B) a second paper-like electrode, comprising nano graphene platelets and a plurality of pores accessible by the liquid electrolyte wherein the second electrode has a specific surface area greater than about 100 m$^2$/gm; and (C) a paper-like or porous electrode separator disposed between the first and second electrodes and the separator comprises the liquid electrolyte which is electrically non-conductive but ionically conductive. The paper-like separator may comprise cellulose fibers. Preferably, the first paper-like electrode comprises a conducting polymer coated on or bonded to at least one of the nano graphene platelets. Alternatively, the first paper-like electrode comprises a transition metal oxide, carbide, or sulfide coated on or bonded to at least one of the nano graphene platelets.

Still another preferred embodiment of the present invention is a flexible hybrid electrochemical cell comprising: (a) a first graphene-based electrochemical capacitor; and (b) a second energy storage or conversion cell in a working relation to the first electrochemical cell, wherein the energy storage or conversion cell is selected from a battery, a fuel cell, a photovoltaic or solar cell, or a combination thereof. In one specific embodiment, the energy storage or conversion cell comprises an electrode comprising a lithium foil or lithium-intercalated material. This flexible hybrid electrochemical cell may comprise a third electrochemical cell in a working relation to said first electrochemical cell or said second energy storage or conversion cell.

It may be noted that prior art workers in the field of graphene-based supercapacitor have failed to recognize the notion that individual nano graphene sheets have a great tendency to re-stack themselves, effectively reducing the specific surface areas that are accessible by the electrolyte in a supercapacitor electrode. The significance of this graphene sheet overlap issue may be illustrated as follows: For a nano graphene platelet with dimensions of l (length)×w (width)×t (thickness) and density ρ, the estimated surface area per unit mass is $S/m=(2/\rho)(1/l+1/w+1/t)$. With ρ=2.2 g/cm$^3$, l=100 nm, w=100 nm, and t=0.34 nm (single layer), we have an impressive S/m value of 2,675 m$^2$/g, which is much greater than that of most commercially available carbon black or activated carbon materials used in the state-of-the-art supercapacitor. If two single-layer graphene sheets stack to form a double-layer NGP, the specific surface area is reduced to 1,345 m$^2$/g. For a three-layer NGP, t=1 nm, we have S/m=906 m$^2$/g. If more layers are stacked together, the specific surface area would be further significantly reduced. These calculations suggest that it is essential to find a way to prevent individual graphene sheets to re-stack and, even if they re-stack, the resulting multi-layer structure would still have inter-layer pores of adequate sizes. These pores must be sufficiently large to allow for accessibility by the electrolyte and to enable the formation of double-layer charges, which typically require a pore size of at least 2 nm.

Thus, another preferred embodiment of the present invention is an asymmetric supercapacitor that features at least one electrode having spacer-modified nano graphene sheets that naturally provide inter-layer pores when they stack or overlap with one another to form a supercapacitor electrode. The resulting electrode exhibits a high surface area typically greater than 100 m$^2$/gm, more typically greater than 300 m$^2$/gm, even more typically greater than 500 m$^2$/gm, and most typically greater than 1,000 m$^2$/gm. In many cases, the specific surface area reaches the theoretical value of 2,675 m$^2$/g, which translates into an ultra high specific capacitance value.

Surface modifications of NGPs to prevent NGP overlapping were achieved by using a spacer approach in which nano-scaled spacer particles are either chemically bonded to or physically attached to a surface of a graphene sheet. It may be noted that although Zhang et al [Ref. 12] produced a hybrid graphene-ZnO film as a supercapacitor electrode, the ZnO layer was a complete, continuous film, which was not in the form of discrete particles and could not serve as a spacer. In Zhang's report, ZnO was used to offer a pseudo-capacitance effect, not a spacer. All metal oxide particles used in the open literature or patent documents by prior art workers were for the purpose of achieving a pseudo-capacitance effect in a carbon-based electrode, not as a spacer.

The spacer-modified platelet comprises: (a) a nano graphene platelet having a thickness smaller than 10 nm (preferably less than 1 nm and most preferably less than 0.4 nm); and (b) discrete, non-continuous, and non-metallic bumps or nodules bonded to a surface of the graphene platelet to serve as a spacer. Preferably, there are multiple bumps or nodules bonded to both surfaces of the platelet to effectively increase a specific surface area of the platelet.

The process for producing spacer-modified nano graphene platelets comprises: (a) dissolving a precursor material in a solvent to form a precursor solution; (b) dispersing multiple nano graphene platelets into the solution to form a suspension, wherein the platelets have a thickness smaller than 10 nm; (c) forming the suspension into a layer of solid film by removing the solvent from the solid and allowing the precursor material to adhere or bond to a surface of the graphene platelets; and (d) thermally or chemically converting the precursor material into spacer nodules bonded to graphene platelet surfaces. Multiple spacer-modified NGPs overlap naturally to form a closely packed, but highly porous mat, web, or paper structure for use as a supercapacitor electrode.

The graphene platelets preferably comprise graphene platelets that have an average thickness no more than 2 nm or no more than 5 graphene layers per platelet and, most preferably, the platelets comprise mostly single-layer graphene to maximize the specific surface area of the resulting electrode. The precursor material contains a material selected from the group consisting of petroleum pitch, coal tar pitch, polymer, resin, aromatic organic molecules, sol-gels, and combinations thereof. The precursor material can contain a precursor to the group of materials consisting of metal oxide, metal carbide, metal nitride, metal sulfide, metal halide, and combinations thereof.

The bumps or nodules contain a material selected from the group consisting of carbon, pitch, metal oxide, metal carbide, metal nitride, metal sulfide, metal halide, and combinations thereof. Preferably, the bumps or nodules contain a material selected from the group consisting of $RuO_2$, $IrO_2$, $NiO$, $MnO_2$, $VO_x$, $TiO_2$, $Cr_2O_3$, $Co_2O_3$, $PbO_2$, $Ag_2O$, $MoC_x$, $Mo_2N$, $WC_x$, $WN_x$, and combinations thereof. In addition to serving as a spacer, the aforementioned metal oxide, metal carbide, metal nitride, metal sulfide, or metal halide also provides a pseudo-capacitance effect to the graphene electrode, significantly increasing the specific capacitance of the electrode.

The spacer carbon may be produced by pyrolyzing a polymeric material coated onto a surface of the graphene platelet. Preferably, the spacer carbon is produced by pyrolyzing a polymeric coating substance selected from the group consisting of phenol-formaldehyde, polyacrylonitrile, styrene divinyl benzene, cellulosic polymers, polyfurfuryl alcohol, cyclotrimerized diethynyl benzene, and combination thereof. The bumps or nodules preferably have a height no less than 1 nm, further preferably no less that 2 nm. The main goal is for the spacer to help create pores that are larger than 2 nm when multiple NGPs are stacked together.

The graphene platelet preferably has no more than 5 graphene layers, more preferably no more than 3 layers, and most preferably single-layer so that the modified nano graphene platelet exhibits a specific surface area greater than 500 $m^2/g$, preferably greater than 900 $m^2/g$, more preferably greater than 1,384 $m^2/g$, and most preferably greater than 2,600 $m^2/g$.

The spacer-modified NGP electrode material may be made into a roll supported by a winder roller or drum. Such a roll of electrode enables continuous, large-scale roll-to-roll production of supercapacitor assembly. Such an electrode roll may be produced in a process comprising: (a) dissolving a precursor material in a solvent to form a precursor solution and dispersing multiple nano graphene platelets into the solution to form a suspension; (b) continuously delivering and forming the suspension into a layer of solid film composed of precursor material-coated graphene platelets overlapping one another, and removing the solvent from the solid film (e.g., a paper-making procedure, a mat-making procedure, or a web-making procedure); (c) continuously converting the precursor material into nodules bonded to surfaces of graphene platelets to form a porous solid film composed of spacer-modified graphene platelets; and (d) continuously collecting the porous solid film on a collector.

In one preferred embodiment, step (b) comprises delivering a controlled amount of suspension onto a moving substrate and forming the solid film on the substrate and step (d) comprises collecting the porous solid film on a winding roller. Step (c) may comprise heating said solid film, or comprises chemically or thermally converting said precursor material into nodules of a material selected from the group consisting of carbon, metal oxide, metal carbide, metal nitride, metal sulfide, metal halide, and combinations thereof.

For convenience, the precursor solid film may be collected on a winding roller first and then, at a later time or at a different operating location, the solid film may be heated to convert the precursor material into a spacer material (e.g. carbon). Hence, another preferred embodiment of the present invention is a process for continuously producing a solid film of spacer-modified nano graphene platelets. The process comprises: (a) dissolving a precursor material in a solvent to form a precursor solution and dispersing multiple nano graphene platelets into the solution to form a suspension; (b) continuously delivering and forming the suspension into a layer of solid film composed of precursor material-coated graphene platelets overlapping one another, and removing the solvent from the solid film (e.g. a paper-making procedure, a mat-making procedure, or a web-making procedure); and (c) continuously collecting the solid film on a collector. The process preferably further comprises a step of heating the solid film to convert the precursor material into nodules bonded to graphene platelet surfaces to form a porous solid film composed of spacer-modified graphene platelets. Preferably, step (b) comprises delivering the suspension onto a moving substrate and forming the solid film thereon, and step (c) comprises collecting the porous solid film on a winding roller.

In any one of the aforementioned processes, one may choose to add a desired amount of a property-modifier material into the suspension wherein the property modifier is selected from the group consisting of carbon nanotubes, carbon nano-wires, carbon nano-fibers, graphitic nano-fibers, carbon black, activated carbon, nano-wires, ceramic nano particles, polymer nano particles, nano particles of metal oxides, particles of metal carbides, metal nitrides, metal sulfides, metal-halogen compounds, metal chalcogenides, and combinations thereof.

The surface-modified nano graphene platelet may be activated to form an activated platelet, functionalized, or both activated and chemically functionalized. In one preferred embodiment, the surface-modified nano graphene platelet is functionalized with one or more functional groups selected from the group consisting of —$SO_3$, —R'COX, —R'$(COOH)_2$, —CN, —R'$CH_2$X, —OH, —R'CHO, —R'CN, wherein R' is a hydrocarbon radical, and wherein X is —$NH_2$, —OH, or a halogen.

A specific embodiment of the present invention is a process for continuously producing a supercapacitor cell assembly. This cell assembly process comprises a step of feeding a porous solid film of spacer-modified nano graphene platelets as an electrode from a feeder roller.

Another embodiment of the present invention is an asymmetric supercapacitor comprising two electrodes, a porous separator disposed between the two electrodes, and electrolyte in physical contact with the two electrodes, wherein at least one of the two electrodes comprise nano graphene platelets (e.g., preferably spacer-modified nano graphene platelets). Most preferably, both electrodes (although having different compositions) contain nano graphene materials, particularly spacer-modified nano graphene platelets. These supercapacitor cells are preferably flexible cells, but the cells of the present invention are not limited to flexible ones.

DESCRIPTION OF THE PREFERRED EMBODIMENTS

The present invention may be understood more readily by reference to the following detailed description of the preferred modes of practice taken in connection with the accompanying drawing figures, which form a part of this disclosure. It is to be understood that this invention is not limited to the specific devices, methods, conditions or parameters described and/or shown herein, and that the terminology used herein is for the purpose of describing particular embodiments by way of example only and is not intended to be limiting of the claimed invention.

As discussed above, the electric vehicle industry and the US Department of Energy (DOE) are pushing the energy storage suppliers to achieve a supercapacitor with a cell level energy density of >10 Wh/kg. In response to the needs of EV industry and under the sponsorship of the US DOE, the applicants conducted extensive and in-depth research efforts to achieve this challenging technical goal, which led to the instant invention. In a preferred embodiment, the present invention provides a flexible, asymmetric electrochemical cell comprising: (A) a sheet of graphene paper as first electrode comprising nano graphene platelets having a platelet thickness less than 1 nm, wherein this first electrode has electrolyte-accessible pores; (B) a thin-film first separator and electrolyte (e.g. porous paper or polymer film with electrolyte permeating into pores of the separator); (C) a thin-film or paper-like second electrode which is different in composition than the first electrode; and wherein the separator is sandwiched between the first and second electrode to form a flexible laminate configuration. Preferably, at least one of the electrodes and separator is thinner than 1 mm, more preferably thinner than 0.1 mm or 100 μm. Most preferably, all electrode and separator layers are thinner than 100 μm.

Figure 1A:
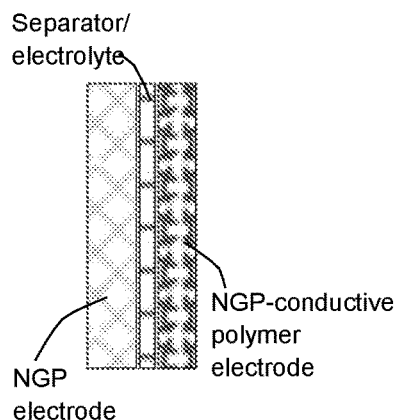
FIG. 1(A) Example of flexible, asymmetric electrochemical cell—a supercapacitor containing an NGP-based electrode that works on a double-layer charge mechanism and a combined NGP-conducting polymer-based second electrode that operates on a redox reaction in addition to the double layer mechanism.
Figure 1B:
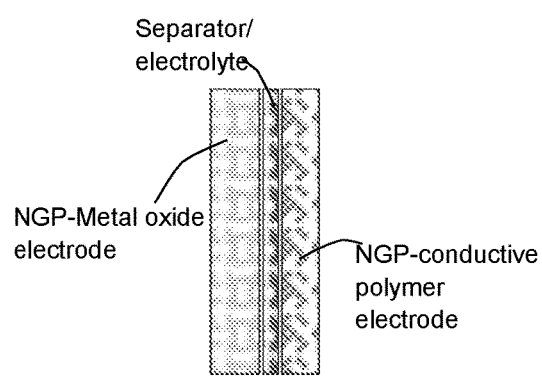
FIG. 1(B) Example of flexible, asymmetric electrochemical cell—an asymmetric supercapacitor having pseudo-capacitance in both electrodes that have different compositions.
Figure 1C:
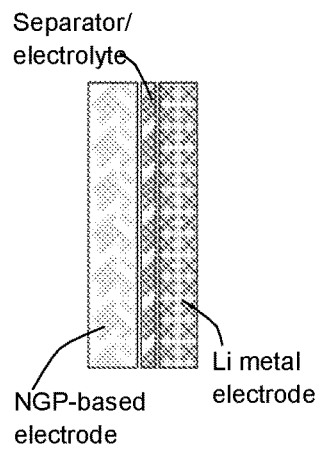
FIG. 1(C) Example of flexible, asymmetric electrochemical cell—schematic of a hybrid cell that contains an NGP-based supercapacitor-type electrode and a lithium metal foil-based battery electrode (This hybrid cell is a building block for a more complex, multi-layer hybrid supercapacitor-battery cell)
Figure 1D:
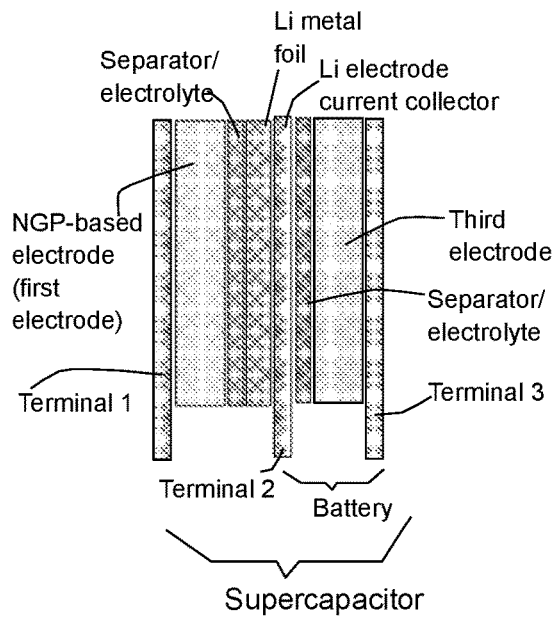
FIG. 1(D) Example of flexible, asymmetric electrochemical cell—a hybrid supercapacitor-battery cell containing two supercapacitor electrodes that can have the same or different compositions.

Illustrated in FIG. 1(A) to FIG. 1(D) are several examples of the presently invented asymmetric electrochemical cells. FIG. 1(A) schematically shows a first supercapacitor containing an NGP-based electrode that works on a double-layer charge mechanism and a combined NGP-conducting polymer-based second electrode that operates on a redox reaction in addition to the double layer capacitance mechanism. FIG. 1(B) shows an asymmetric supercapacitor having pseudo-capacitance in both electrodes that have different compositions. FIG. 1(C) is schematic of a hybrid cell that contains an NGP-based supercapacitor-type electrode and a lithium metal foil-based battery electrode. This hybrid cell is a building block for a more complex, multi-layer hybrid supercapacitor-battery cell. FIG. 1(D) is a hybrid supercapacitor-battery cell containing two supercapacitor electrodes that can have the same or different compositions. Preferably, the electrodes and separators are thin-film or paper-like structures so that the resulting electrochemical cell is mechanically flexible.

The theories behind the present invention, the material compositions, related processes, and electrochemical performance of asymmetric electrochemical cells are now discussed in more details in the following:

A. Nano Graphene Platelets (NGPs)

Carbon materials can assume an essentially amorphous structure (glassy carbon), a highly organized crystal (graphite crystal or crystallite), or a whole range of intermediate structures that are characterized by having various proportions and sizes of graphite crystallites and defects dispersed in an amorphous carbon matrix. Typically, a graphite crystallite is composed of a number of graphene sheets or basal planes (also referred to as a-b planes) that are bonded together through van der Waals forces in the c-axis direction, the direction perpendicular to the basal plane. Due to the multi-layer nature (multiple graphene sheets stacked together) of graphite crystallites, a graphite or graphitic carbon material is often referred to as a laminar or layered graphite material. These graphite crystallites are typically micron- or nanometer-sized in the a- or b-direction (these are called La dimension). The c-directional dimension (or thickness) is commonly referred to as Lc. The inter-planar spacing of a perfect graphite is known to be approximately 0.335 nm (3.35 Å). The graphite crystallites are dispersed in or connected by crystal defects or an amorphous phase in a graphite particle, which can be a graphite flake, carbon/graphite fiber segment, carbon/graphite whisker, or carbon/graphite nano-fiber. In the case of a carbon or graphite fiber segment, the graphene plates may be a part of a characteristic "turbostratic" structure. Natural graphite or synthetic graphite (such as highly oriented pyrolytic graphite) tends to have relatively large La and Lc dimensions. Any type of the aforementioned graphite particle can be used as a starting material for preparing the presently invented NGPs for use in a supercapacitor electrode.

For a laminar graphite material (such as a natural flake graphite, spheroidal graphite, synthetic graphite, highly oriented pyrolytic graphite, meso-carbon micro-bead, carbon/graphite fiber segment, carbon/graphite whisker, carbon/graphite nano-fiber, and carbon nano-tube), the distance between two graphene sheets (basal plane layers) is typically in the range of 0.335 nm-0.340 nm. By subtracting one graphene plane thickness from this inter-planar spacing, one obtains an interstitial space of smaller than 0.27 nm, which is too small to accommodate most of the electrolyte species. This implies that the inter-planar spaces cannot form an electrical double-layer and that only the exterior surfaces of laminar graphite particles are capable of forming electrical double layers if any of these laminar graphite materials is used as an electrochemical chemical (EC) capacitor electrode. Unfortunately, most of these laminar graphite particles (e.g., natural flake graphite, spheroidal graphite, synthetic graphite, highly oriented pyrolytic graphite, meso-carbon micro-bead, and carbon/graphite fiber segment) do not have very high specific surface area, typically lower than 100 $m^2$/g and mostly lower than 10 $m^2$/g. Carbon nano-tubes (CNTs) do possess a high specific surface area, but they are very expensive and high purity remains difficult to achieve.

Our research group led by B. Jang was among the first to extract or isolate individual graphene planes (single-layer graphene) from laminar graphite materials. Single-layer graphene and multi-layer graphene are collectively referred to as nano graphene platelets (NGPs). For the purpose of defining the geometry and orientation of an NGP, the NGP is described as having a length (the largest dimension), a width (the second largest dimension), and a thickness. The thickness is the smallest dimension, which is no greater than 100 nm, but can be as small as 0.34 nm when NGP is single-layer graphene. When the platelet is approximately circular in shape, the length and width are referred to as diameter. In the presently defined NGPs, both the length and width are smaller than 1 μm and more preferably and typically smaller than 0.5 μm (500 nm). We have been able to produce NGPs with length smaller than 100 nm. NGPs provide exceptionally high specific surface areas that could translate into ultra-high specific capacitance if NGPs are used as a primary supercapacitor electrode material.

B. Symmetric Versus Asymmetric Supercapacitors (Theoretical Considerations)

When the electrochemical capacitor is operated on the basis of electric charges stored in an electric double layer produced at the interface between a polarized electrode material and the electrolyte, the energy W accumulated in the electric double layer at the time the electro-chemical capacitor is discharged at a constant current I from a voltage $V_i$ to a voltage $V_j$ may be expressed by the following equation:

$$W = \tfrac{1}{2} C(V_i^2 - V_j^2) = \tfrac{1}{2} C[(V_0 - IR)^2 - V_j^2] \quad (1)$$

This equation indicates that, in order to increase the energy density of the electrochemical capacitor, it is necessary to increase the capacitance C or the open-circuit voltage $V_0$, or to reduce the internal resistance R. The capacitance C increases in proportion to the effective interface area between the polarized electrode and the electrolyte, and is determined by a tolerable voltage that is governed by the reactivity between the polarized electrode and the electrolyte. One objective of the present invention was to significantly increase the effective interface area without compromising the tolerable voltage through the creation of large amounts of inter-graphene in an NGP-based electrode.

The internal resistance R includes the electric resistance of the electrode itself, and also a diffusion resistance for ions to move in the pores of the electrode and a diffusion resistance for ions to move in the electrolyte. The diffusion resistance for ions to move in the electrolyte is in inverse proportion to the ion conductivity of the electrolyte. Consequently, it is generally desired to have an electrolyte of high ion conductivity. The resistance of a conventional electrode is a combination of the resistances of both the electrode active material and the binder, matrix, or substrate material that is used to hold the active material, and how these two materials are combined together. A second major objective of the present invention was to significantly reduce the electrode resistance by forming a network of interconnected NGPs to maintain a network of electron-conducting paths. The surfaces of these graphene sheets (particularly when they are ultra-thin) provide exceptional amounts of electrolyte-electrode interface areas where electrical double layers can be readily formed.

The electrochemical capacitor or supercapacitor may also operate additionally on the Faradaic or pseudo-capacitance effect, for instance, via a fast redox reaction. Hence, a third objective of the present invention was to provide a composite electrode that can exhibit a high pseudo-capacitance through the presence of selective active nano-particles, such as transition metal oxides, carbides, or nitrides, or conductive polymer-graphene redox pairs, or through surface functionalization of the invented graphene electrode. Such a composite electrode can be used in one or both of the two electrodes in a supercapacitor cell. For an asymmetric supercapacitor, the two electrodes can be both Faradaic-type, but with different compositions or different capacitance mechanisms (e.g., one is NGP-conducting polymer pair and the other NGP-metal oxide pair). Alternatively, one is double-layer type and the other Faradaic type, further discussed below.

Conventional ECs are typically symmetric supercapacitors that employ similar materials or similar charge storage mechanisms for both electrodes. In contrast, asymmetric supercapacitors utilize two different materials or different charge storage mechanisms for the electrodes. Mechanisms of energy storage include charge separation (electric double layer) and Faradaic processes (electron transfer). The Faradaic processes provide pseudo-capacitance effects, occurring at the solid-electrolyte interface due to electrochemical phenomena such as redox reactions. There are several significant advantages associated with asymmetric ECs that have been under-appreciated by EC researchers.

An asymmetric supercapacitor offers higher energy density and other advantages:

(1) The device capacitance is almost equal to the capacitance of the electrode having the smallest capacitance. This may be illustrated as follows: With two capacitors connected in series, we have $1/C_T=1/C_1+1/C_2$ and, hence, $C_T=C_1C_2/(C_1+C_2)$. This equation may be further simplified as $C_T=[n/(n+1)]C_2$, where $C_1=nC_2$. In a symmetric supercapacitor, $C_1=C_2$ and $n=1$, we have $C_T=\frac{1}{2} C_2$, yielding a device capacitance about one-half that of each electrode. In contrast, If $C_1 \gg C_2$ or $n \gg 1$, $C_T=C_2$, yielding a device capacitance almost equal to the capacitance of the lower-capacity electrode.

(2) Because one electrode material has such a high capacity, its mass and volume can be much smaller than those of the other electrode. The high-capacity electrode can thus have negligible mass or volume compared to the other electrode, which further increases the energy density of the asymmetric supercapacitor.

(3) An asymmetric supercapacitor with aqueous electrolyte can reliably operate at voltages above 1.22 V without gas evolution. For example, known asymmetric supercapacitors can operate at 1.7 to 1.8 V, almost double that of commercially available symmetric aqueous supercapacitors. This higher voltage provides almost a four-fold increase in energy density. These three factors can combine to increase the energy density of an asymmetric supercapacitor to eight or more times that of a symmetric supercapacitor.

(4) The larger-capacitance electrode experiences a small voltage swing as compared with the smaller-capacitance electrode during charging and discharging of the device. This is because of the difference in the capacitances of the electrodes, in that the stored charges $Q_1$ and $Q_2$ for the electrodes are identical. Since $Q_1=C_1\Delta V_1=Q_2=C_2\Delta V_2$, where $\Delta V_1$ and $\Delta V_2$ are voltage changes, and since $C_1 \gg C_2$, $\Delta V_1 \ll \Delta V_2$. This small voltage swing on the larger capacitance electrode leads to a long life for that electrode, since large voltage swings on electrodes using Faradaic processes tend to result in a shorter electrode cycle life.

(5) The high energy density of such high-capacity devices may be maintained when the devices are in high-voltage series strings. Each cell in the string of series-connected capacitors operates at the single-cell voltage. The string is inherently balanced, so there is no need for external circuit balancing as is commonly done in the conventional symmetric supercapacitors.

C. A Major Breakthrough in Supercapacitor Technology

The high capacity NGP-based electrode, when coupled with a metal oxide-, metal sulfide-, metal carbide-, or conductive polymer-based Faradaic electrode, can form an asymmetric electrochemical capacitor with significantly increased capacity and specific energy. Being also carbon-based structures, NGP electrodes exhibit the same good cycle life and low temperature performance.

Figure 2:
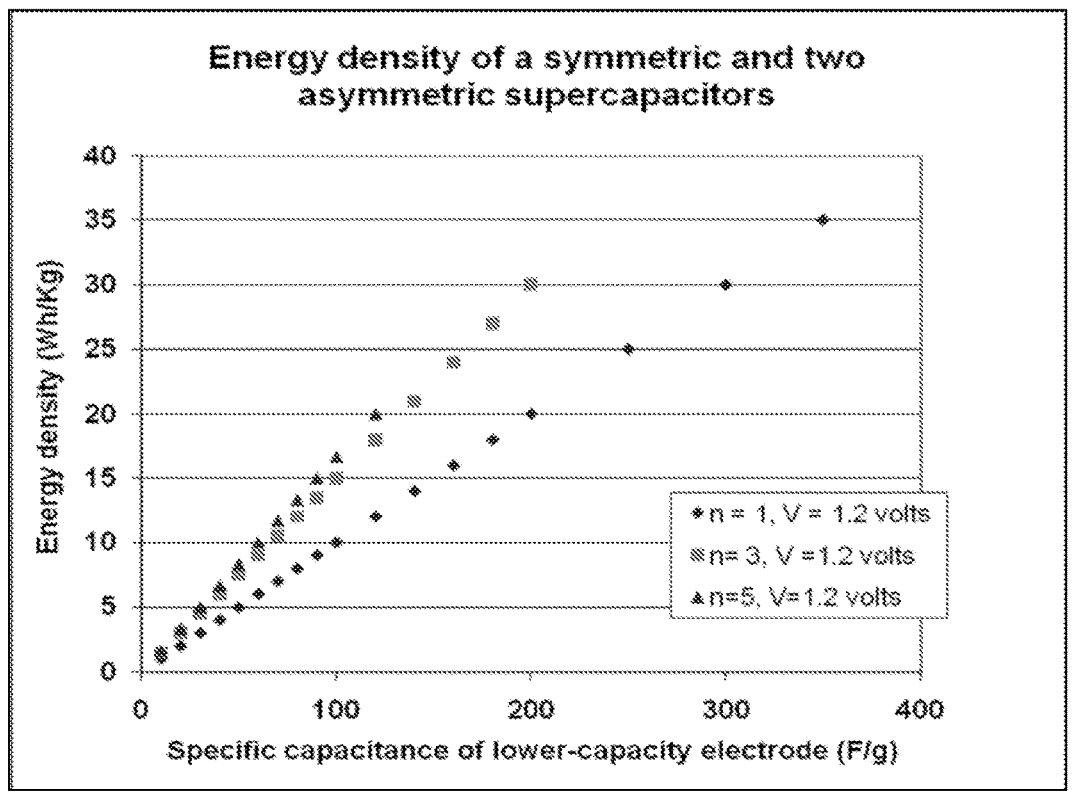
FIG. 2 Specific energy of three hypothetical supercapacitor cells to illustrate the significance of the degree of asymmetry (ratio of high capacitance/lower-capacitance between the two electrodes) on capacitor performance: a symmetric and two asymmetric supercapacitors, all operating at a voltage of 1.2 volts.

FIG. 2 shows the specific energy density of three hypothetical supercapacitors (1 symmetric and 2 asymmetric) plotted as a function of the specific capacitance, $C_2$, of the lower-capacity electrode, where the operating voltage is assumed to be 1.2 volts and the degree of asymmetry is defined as $n=C_1/C_2$. It is clear that the DOE target of 10 Wh/Kg at the cell level can be achieved if the lower-capacity electrode has a specific capacitance of 70 F/g or higher. If the weights of electrolyte and separator (adding 50%) are taken into consideration, we may raise the target to 15 Wh/Kg, which can be achieved with specific capacitance of 100 F/g. All these target values have been achieved with the presently invented electrode materials.

Figure 3:
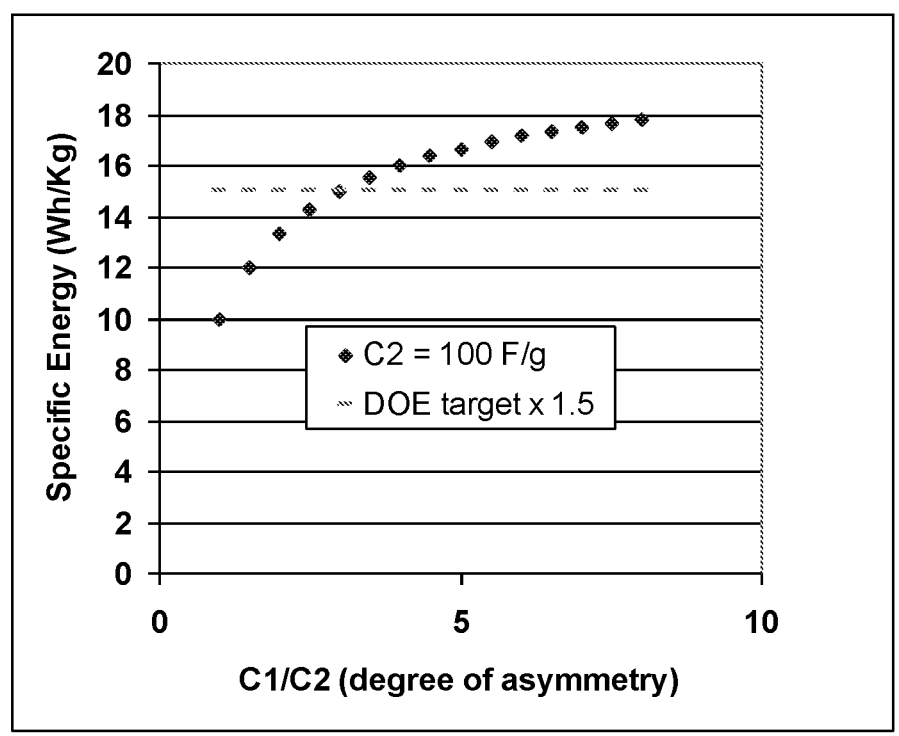
FIG. 3 Specific energy of asymmetric supercapacitors as a function of the degree of asymmetry with the lower capacitance electrode having a specific capacitance of 100 F/g (a readily achievable goal with the presently invented technology) and an operating voltage of 1.2 volts.
Figure 4:
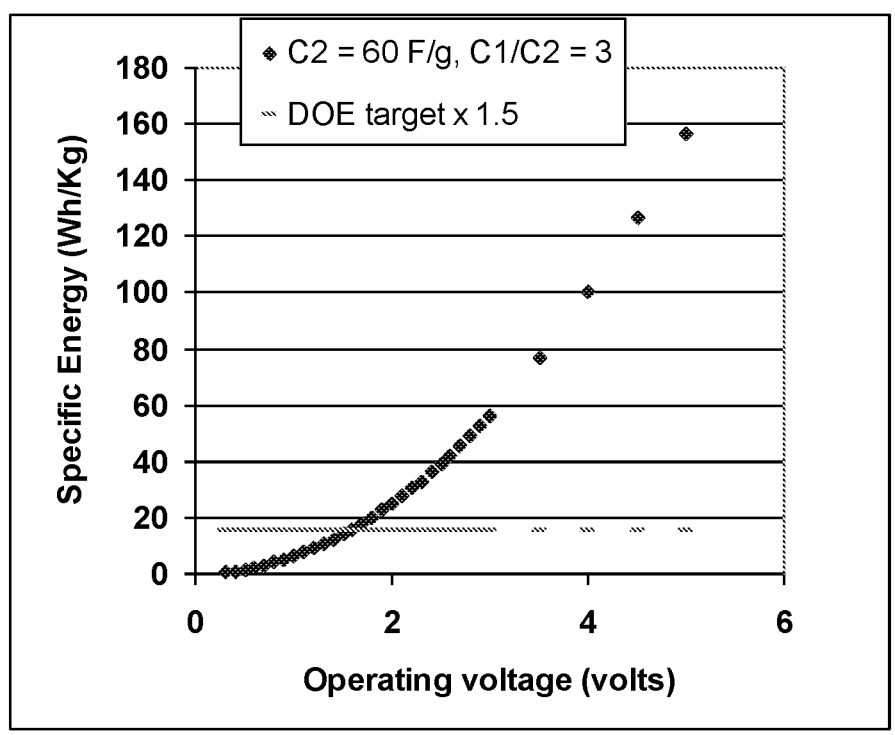
FIG. 4 Specific energy values of asymmetric supercapacitors as a function of the operating voltage with the lower capacitance electrode having a specific capacitance of 60 F/g and higher capacitance electrode having a specific capacitance of 180 F/g (readily achievable goals with the presently invented technology).
Figure 5:
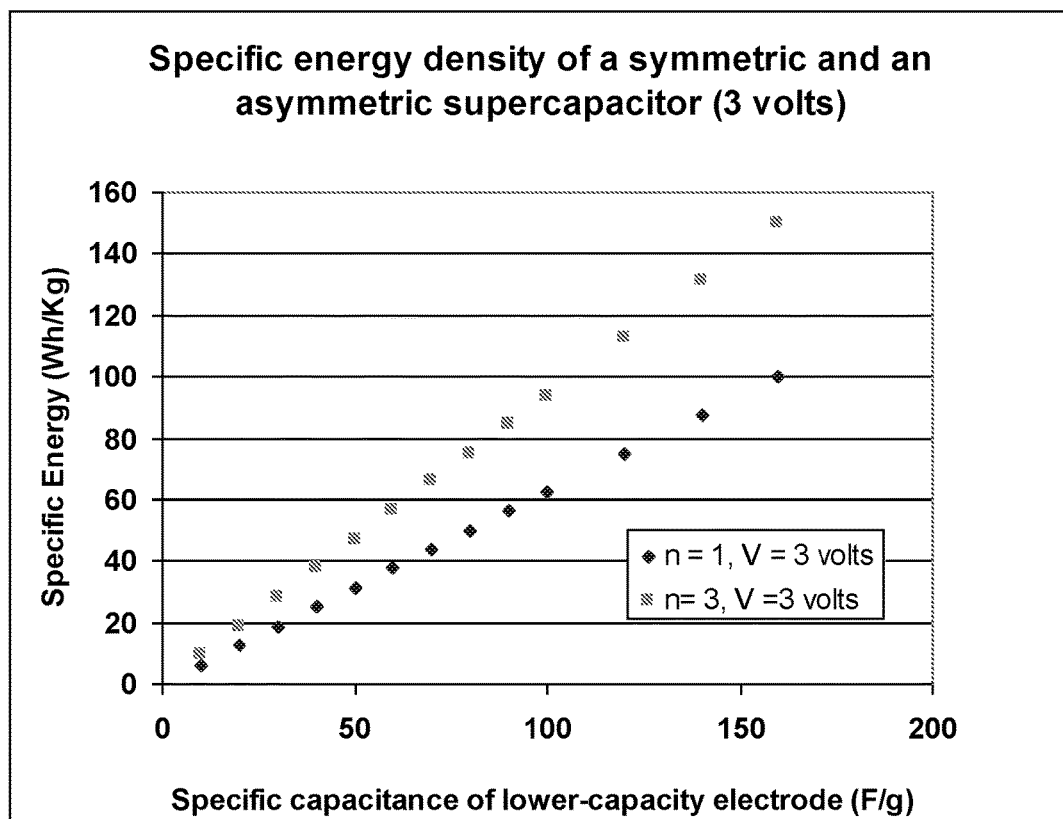
FIG. 5 Specific energy values of supercapacitor cells as a function of the specific capacitance of the lower-capacity electrode for a symmetric and an asymmetric cell, all operating at a voltage of 3.0 volts. This demonstrates that the presently invented electrodes, with a high specific capacitance, provide an asymmetric supercapacitor with an exceptionally high specific energy, much higher than the DOE-mandated value of 10 Wh/kg.

Additional advantages of developing asymmetric supercapacitors are further illustrated in FIG. 3 and FIG. 4. FIG. 3 shows that the degree of asymmetry plays a significant role in dictating the specific energy of a supercapacitor cell. Furthermore, since an asymmetric supercapacitor with aqueous electrolyte can safely operate at voltages above 1.22 V (often >1.6 V) as opposed to <1.2 V for a symmetric structure, FIG. 4 indicates that the DOE target can be reached even if the lower-capacity electrode has a specific capacitance of only 60 F/g. FIG. 4 further suggests that the specific energy can be significantly increased if an electrolyte with a higher operational voltage is utilized. In order to accomplish this high voltage goal, we also investigated the use of several room temperature ionic liquids as electrolytes and found that many of them can operate in the voltage range of typically 3-5 volts. As illustrated in FIG. 5, when an ionic liquid with an operational voltage of 3.0 volts is used, the specific energy of an asymmetric supercapacitor can reach a value greater than 100 Wh/kg., which is comparable to the typical specific energy density (120-160 Wh/kg) of commercially available lithium ion batteries. However, compared to lithium ion batteries, supercapacitors can be charged and discharged at a rate that is orders of magnitude faster (1 second as opposed to 1 hour, for instance) for a much longer cycle life (millions of cycles as opposed to hundreds of cycles). A specific energy of 30-100 Wh/kg for a supercapacitor is considered a revolutionary achievement in the art of supercapacitor!

A preferred embodiment of the present invention is an asymmetric supercapacitor having at least one electrode comprising an NGP-based meso-porous nanocomposite material that contain fully separated NGPs dispersed in, bonded by, or coated with a matrix or binder material, wherein the platelets have a thickness no greater than 10 nm (preferably smaller than 1 nm and most preferably smaller than 0.34 nm, or mostly single-layer graphene). Preferably, the platelets have an average length, width, or diameter no greater than 10 μm, preferably smaller than 1 μm, and most preferably smaller than 500 nm. When the platelets have an average thickness no greater than 10 nm, the resulting nanocomposite tends to have a surface area greater than 300 $m^2/gm$. When the average NGP thickness is 2 nm or smaller, the resulting nanocomposite typically has a surface area greater than 500 $m^2/gm$. When most of the NGPs are single-layer graphene, a specific surface area greater than 2,600 $m^2/gm$ can be readily achieved. With a further treatment of the binder or matrix material, such as activation or carbonization, the total surface area could be further increased. The meso-porous nanocomposite can be made into thin, paper-like sheet and, hence, the resulting supercapacitor can be very flexible.

The nano graphene platelets in a flexible meso-porous composite structure are present in an amount no less than 15% by weight (preferably greater than 50% and more preferably greater than 80%) based on the total weight of the NGPs and a matrix, binder, or a coating material combined. This amount is preferably selected to be sufficiently high to make the nanocomposite electrically conductive with a bulk conductivity no less than 1 S/cm (when no pore exists). The amount of pores are such that the total surface area of the resulting nanocomposite is no smaller than 100 $m^2/gm$, preferably no smaller than 200 $m^2/gm$, more preferably greater than 500 $m^2/gm$, and most preferably greater than 1000 $m^2/gm$ when the composite is used as a supercapacitor material.

Figure 6A:
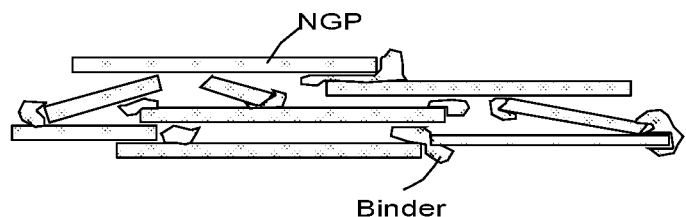
FIG. 6(A) Schematic of meso-porous NGP-based electrodes comprising NGPs bonded by a conductive binder that can be a conducting polymer or carbon (e.g., polymeric carbon)

Schematically shown in FIG. 6(A) is one form of the invented flexible meso-porous nanocomposite structure wherein NGPs are bonded with a binder to ensure that there is a minimal overlap or re-stacking between platelets. The binder is preferably selected from a conductive material, such as an intrinsically conductive polymer (conjugate chain polymers, polyaniline, polypyrrole, polythiophene, etc.), polymeric carbon, and amorphous carbon. Although not a preferred choice, a non-conducting polymer such as Teflon (polytetra-fluoroethylene) or poly (vinylidene fluoride) can be used as a binder to help consolidate the NGPs. It is most preferred that the pores are sized between 2 nm and 10 nm. A conducting polymer provides an opportunity for added pseudo-capacitance due to the redox effect intrinsic to the conducting polymer or between the conducting polymer and the NGP. A carbon binder can be derived from a precursor polymer, coal tar pitch, or petroleum pitch through pyrolyzation (heat-induced carbonization), which produces additional pores and surface areas.

Figure 6B:
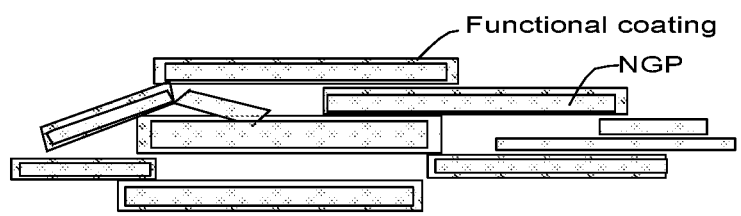
FIG. 6(B) Schematic of meso-porous NGP-based electrodes comprising NGPs coated with a thin layer of conducting polymer or surface functional groups.

Another flexible nanocomposite electrode is schematically shown in FIG. 6(B) wherein individual NGPs are coated with an ultra-thin layer of conducting polymer, carbon, metal oxide, carbide, sulfide, and/or surface functional groups that could promote pseudo-capacitance. The coating can more or less cover the entire exposed surface of a NGP. Again, the NGPs are arranged in such a manner that there are a large number of minute pores which are preferably greater than 2 nm but smaller than 1:m in size, further preferably between 2 nm and 100 nm and most preferably between 2 nm and 10 nm. If the pore size is smaller than 2 nm, the double-layer capacitance zone cannot be completely formed. If the pore sizes are too large, the surface area per unit volume of electrode material would be too small. The pores are preferably also interconnected to make them accessible by the liquid electrolyte when used in a supercapacitor electrode.

Figure 6C:
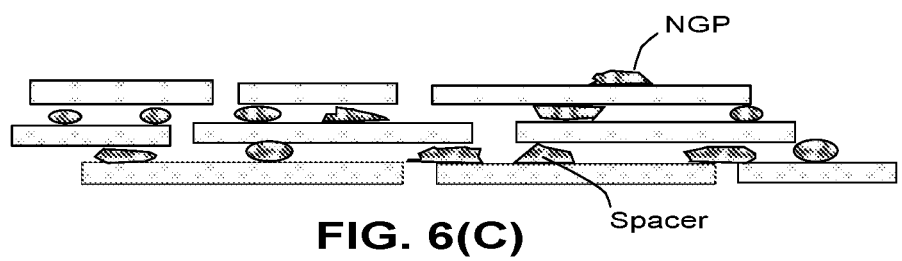
FIG. 6(C) Schematic of meso-porous NGP-based electrodes comprising spacer-modified NGPs self-assembled to form an ordered, porous mat or paper structure.

Another preferred embodiment of the present invention is a supercapacitor electrode that is composed of spacer-modified nano graphene platelets as shown in FIG. 6(C). A spacer-modified NGP comprises: (a) a nano graphene platelet having a thickness smaller than 10 nm (preferably less than 1 nm and most preferably less than 0.4 nm); and (b) discrete, non-continuous bumps or nodules bonded to a surface of the graphene platelet to serve as a spacer. Preferably, there are multiple bumps or nodules bonded to both surfaces of a platelet to effectively increase a specific surface area of the platelet.

The preparation and characteristics of flexible meso-porous NGP nanocomposites are further described in what follows (as examples): In one process, a meso-porous nanocomposite can be obtained by freeze-drying, which entails first dispersing NGPs in a polymer-solvent solution to form a NGP suspension. This suspension is then formed into a desired shape with the solution being rapidly frozen (e.g., using liquid nitrogen as a cooling medium). The frozen "solid" is subjected to a vacuum- or pumping-assisted procedure to facilitate sublimation of the solvent, leaving behind NGPs, the solid polymer, and a large amount of pores. If the polymer is a conducting polymer, no further chemical treatment is needed (except for conversion of a precursor polymer to a conductive polymer) and the resulting material is a good meso-porous nanocomposite that can be shaped into a paper-like flexible supercapacitor electrode. Conducting (conjugate-chain) polymers, such as polyaniline, and their soluble precursor polymers are good choices for use in the present invention. Alternatively, a non-conducting material can be converted to become a polymeric carbon by pyrolization, which involves heating to disintegrate the polymer and removing most of the non-carbon elements from the material. The non-carbon elements, forming molecules like carbon dioxide, escape from the polymer, creating minute pores.

Alternatively, a polymer and NGPs can be mixed through solution mixing or melt blending to form a NGP nanocomposite. The polymer is preferably one that has a high carbon yield such as phenolic resin and polyacrylonitrile (PAN). The polymer nanocomposite is then pyrolyzed to become carbon nanocomposite. The removal of non-carbon elements from the polymer generates a large number of pores that are by and large interconnected to allow for accessability of liquid electrolyte. This pyrolization procedure could significantly increase the surface area from typically 100-200 $m^2/gm$ to above 300 $m^2/gm$ (typically 500-1,000 $m^2/gm$), a highly desirable result. The meso-porous carbon nanocomposite may be subjected to an activation treatment (analogous to activation of carbon black materials) to create additional surfaces and possibly imparting functional chemical groups to these surfaces. The activation treatment can be accomplished through $CO_2$ physical activation, KOH chemical activation, or exposure to nitric acid, fluorine, or ammonia plasma. Again, this meso-porous polymer can be made into paper-like flexible electrode structure.

Further alternatively, the meso-porous carbon nanocomposite (with or without an activation treatment) may be surface functionalized or coated with a conducting polymer. Conducting polymers, such as polyacetylene, polypyrrole, polyaniline, polythiophene, and their derivatives, are good choices for use in the present invention. These treatments are intended for further increasing the capacitance value through pseudo-capacitance effects such as redox reactions. Alternatively, transition metal oxides or sulfides such as $RuO_2$, $TiO_2$, $MnO_2$, $Cr_2O_3$, and $Co_2O_3$ can be deposited onto the NGP surface for pseudo-capacitance. Other useful surface functional groups may include quinone, hydroquinone, quaternized aromatic amines, mercaptans, or disulfides. This latter class of functional groups also has been shown to impart pseudo-capacitance to CNT-based supercapacitors.

In another preferred embodiment, polymer-coated NGPs can be prepared by dispersing NGPs in a dilute polymer-solvent solution. By stir-mixing these platelets in the solution, separating these platelets from the solution via filtering, and then removing the solvent (in a vacuum oven or chemical fume hood) one obtains NGP platelets which are each surface-coated with a thin layer of polymer. A structure containing polymer-coated NGPs can then go through the procedures described above to produce meso-porous nanocomposites.

In another preferred embodiment of the present invention, a porous composite can be made to an appropriate shape by a conventional slurry molding technique using NGPs, possibly along with a small amount of carbon nano-fibers (CNFs), carbon nanotubes (CNTs) or other nano-scaled fillers, if so desired. An aqueous slurry is prepared which comprises a mixture of NGPs with an intended matrix polymer, and possibly along other conductive ingredients such as carbon fibers, metal fibers, CNTs, CNFs, EGFs, carbon blacks, metal particles, or a combination thereof. The matrix polymer is typically a thermoplastic in a powder, granule, or, preferably, fibrous or filamentous form. The slurry, consisting of NGPs, other optional fillers, polymer particles/fiber segments, and water, is forced through a sieve or mold screen of a desired mesh size to trap the solids (allowing water to go through), thus producing a wet monolithic, which is subsequently dried at a temperature of less than 80 EC. This mold screen may be a part of a mold. The initial porosity of the preform in the slurry molded and dried condition is typically in the range 30-70%. If necessary, the dried monolith preform is further densified via compression. The resulting solid mixture may be transferred to a hot pressing mold cavity for compression molding into a useful shape, such as a supercapacitor electrode. During the molding procedure, the thermoplastic fibers or powders get melted and the resulting polymer fluid flows around the reinforcement elements (i.e., NGPs and EGFs.) to become the binder or matrix of a composite, which is then pyrolized to become a meso-porous nanocomposite.

In another preferred embodiment, the porous structure can be made by using a platelet/resin spraying technique. The directed platelet spray-up process utilizes an air-assisted gun which conveys reinforcement elements (NGPs) and a resin to a molding tool (e.g., a perforated metal screen shaped identical or similar to the part to be molded). In addition to NGPs, other conductive ingredient such as metal fibers, carbon nano-tubes, graphitic nano-fibers, carbon fibers, carbon blacks, or a combination thereof can be a part of the air-driven stream of preform ingredients that impinges upon the metal screen. This shaped screen can be a part of a mold. The NGPs may be held in place on the screen by a large blower drawing air through the screen. Once the desired thickness of reinforcement has been achieved, the spraying system is turned off and the preform is ready for subsequent molding operations, which could entail polymerizing or curing the resin (if thermosetting) or heating and cooling the resin (if thermoplastic). The composite structure may be subsequently pyrolyzed to obtain a meso-porous nanocomposite.

Figure 7:
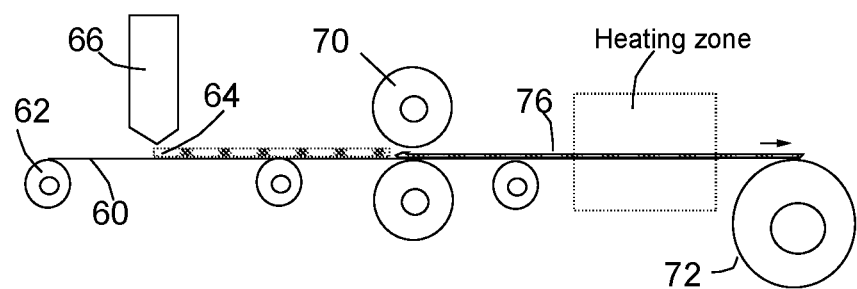
FIG. 7 Schematic of a roll-to-roll slurry molding- or directed platelet/resin spray-based process for producing a flexible paper-like NGP-based electrode material.

Both the slurry molding and directed spraying routes can be implemented as a continuous, roll-to-roll process. For instance, as shown in FIG. 7, the process begins with pulling a web 60 (porous sheet) from a roller 62. The moving web receives a stream of slurry 64 (as described in the above-described slurry molding route) from a slurry dispenser 66. Water sieves through the web with all other ingredients (a mixture of NGPs and thermoset powders or thermoplastic fibers, etc.) remaining on the surface of the web. These solid ingredients are moved forward to go through a compaction stage by a pair of compaction rollers 70 to obtain a slightly compacted composite sheet 76. Heat may be supplied to the mixture before, during, and/or after compaction to begin to cure the thermoset resin or begin to melt the thermoplastic. The mixture or preform can be taken up on a winding drum 72 for later use (e.g., shaping and pyrolyzation treatments). For instance, NGP/phenolic resin can be subjected to pyrolyzation treatments to convert phenolic resin to a carbon matrix, resulting in a meso-porous NGP carbon/carbon nanocomposite. Carbonization of a polymer, either thermoplastic or thermoset, can be conducted in an inert atmosphere at a temperature in the range of 300-500 EC first, which is then followed by a higher temperature treatment at 500-2500 EC. The resulting structure is highly porous and the sheet can be thin and flexible.

Similar procedures may be followed for the case where the mixture of NGPs and polymer powders or fibers is delivered to the surface of a moving web 60 by compressed air, like in a directed platelet/resin spraying route described above. Air will permeate through the web with other solid ingredients trapped on the surface of the web, which are conveyed forward. The subsequent operations are similar to those involved in the continuous slurry molding route. This is a roll-to-roll or reel-to-reel process amenable to mass production of flexible sheets for electrodes.

Both the slurry molding and directed spraying techniques can be used to form a mat or web of NGPs or EGFs, which may be optionally bonded by a binder. The resulting mat can be used as an electrode (typically an anode) on to which a conducting polymer is electro-polymerized.

As indicated earlier, additional fillers (preferably nano-scaled) may be added to the NGP composites to modify other desirable electrode properties, such as strength, stiffness, and toughness. These nano-scaled fillers may be selected from the group consisting of carbon nanotubes, carbon nano fibers, carbon blacks, nano-powders, and combinations thereof. These nano materials may also be used herein to serve as a spacer.

In a spacer-modified NGP electrode, a preferred material for the spacer (a bump or nodule bonded to an NGP surface) is carbon due to its good ability to bond to the graphene substrate and carbon is also known to be capable of forming double layer charges near its interface with the electrolyte. As an example, discrete carbon nodule-bonded graphene sheets may be obtained with any one of the following processes:

The first process entails:
(a) dispersing or immersing a laminar graphite material (e.g., natural graphite powder) in a mixture of an intercalant and an oxidant (e.g., concentrated sulfuric acid and nitric acid, respectively) to obtain a graphite intercalation compound (GIC) or graphite oxide (GO);

(b) exposing the resulting GIC or GO to a thermal shock, preferably in a temperature range of 600-1,100° C. for a short period of time (typically 15 to 60 seconds), to obtain exfoliated graphite or graphite worms (some oxidized NGPs with a thickness <100 nm could be formed at this stage if the intercalation/oxidation step was allowed to proceed for a sufficiently long duration of time; e.g. 24 hours);

(c) re-dispersing the exfoliated graphite to a liquid medium containing an acid (e.g., sulfuric acid), an oxidizing agent (e.g. nitric acid), or an organic solvent (e.g., NMP) to form a suspension. Stirring, mechanical shearing, or ultrasonication can be used to break up graphite worms to form oxidized NGPs to accelerate the dispersion step;

(d) optionally allowing the oxidized NGPs to stay in the liquid medium at a desired temperature for a duration of time until the oxidized NGPs are converted into individual single-layer graphene oxide sheets dissolved in the liquid medium;

(e) dissolving a desired amount of polymer, resin, or pitch (e.g., petroleum or coal tar pitch) in the liquid medium to form a suspension;

(f) casting or delivering a controlled amount of the suspension into a solid film (with solvent being removed, e.g. via vaporizing), which is composed of polymer-, resin-, or pitch-coated NGPs overlapping one another (preferably with a resin-to-NGP weight ratio of 1/100 to 1/10);

(g) carbonizing the polymer, resin, or pitch at a temperature of 400-1,200° C. for typically 0.5 to 5 hours to form discrete carbon nodules bonded onto NGP surfaces. The solid film becomes a porous film, with multiple nodule- or spacer-bonded NGPs stacking up over one another to form inter-NGP pores.

It may be noted that steps (a) to (c) are the most commonly used steps to obtain graphene oxide platelets in the field. However, we were surprised to observe that step (d) was capable of converting all NGPs into single-layer graphene or graphene oxide sheets dissolved or dispersed in a liquid. Oxidized NGPs or GO platelets may be chemically reduced to recover conductivity properties using hydrazine as a reducing agent.

As a second example, the process includes:

(a) Preparing a suspension containing pristine nano graphene platelets (NGPs) dispersed in a liquid medium using, for instance, direct ultrasonication (e.g., a process disclosed by us in U.S. patent application Ser. No. 11/800, 728 (May 8, 2007));

(b) dissolving a desired amount of polymer, resin, or pitch (e.g., petroleum or coal tar pitch) in the liquid medium to form a suspension containing NGPs dispersed in a solution;

(c) casting the suspension to form a layer of film and removing (e.g. vaporizing) the liquid to form a solid film composed of polymer-, resin-, or pitch-coated NGPs (e.g., resin-to-NGP weight ratio of 1/100 to 1/10); and (d) carbonizing the polymer, resin, or pitch at a temperature of 400-1,200° C. for typically 0.5 to 5 hours to form a porous solid film composed of discrete carbon nodule-bonded NGPs.

In both examples, the suspension preparation, casting (film forming), and conversion procedures can be carried out continuously. The resulting porous solid film can be collected onto a winding roller. This process is again a continuous, roll-to-roll process suitable for large-scale production of flexible electrodes.

Supercapacitors coupled with batteries have been considered promising hybrid devices that combine the best features of a battery and a supercapacitor. A battery and a supercapacitor device as herein described could be integrated in parallel to build a hybrid, which is similar to a conventional hybrid. In this case, the battery segment of the hybrid is used to charge the adjoining supercapacitor. In addition to this traditional hybrid, the NGP-based nanocomposite units also allow for building new kinds of merged hybrid devices (with three terminals, as schematically shown in FIG. 1(D)), which would act as both battery and supercapacitor, a dual storage device. The Li metal layer (anode; terminal 2) and a nanocomposite film (cathode; terminal 3) with some electrolyte (e.g., 1 M LiPF6 in water) forms the battery part of the hybrid, whereas the NGP nanocomposite unit (Terminal 1—separator—room temperature ionic liquid electrolyte) assembled adjacent to the battery on the side of the Li layer forms the supercapacitor between terminals 1 and 3. A wide range of room temperature ionic liquids are commercially available, among which 1-butyl,3-methylimidazolium chloride ([bmIm][Cl]) is a preferred choice.

During the operation of the device, the Li electrode (terminal 2) and the supercapacitor electrode (terminal 1) are electrically connected, and the discharge of the battery is used to charge the supercapacitor. The charging of the supercapacitor takes place because of intercalation at terminal 2; a $PF^{-6}$ double layer forms on the surface of the battery cathode (terminal 3), in addition to the electric double layer formed at the supercapacitor electrode (terminal 1). The electric double layers (between terminals 1 and 3) in the supercapacitor can be discharged later in the supercapacitor mode. Hence the device acts as both a supercapacitor and a battery, a true hybrid, relative to the conventional hybrid. In FIG. 1(D), Terminal 3 (a current collector) may be made out of a nano-structured mat or paper composed of NGPs, carbon nano-tubes, carbon nano-fibers, or their combinations, forming three-dimensional network of electron-conductive paths and pores.

The following examples serve to illustrate the preferred embodiments of the present invention and should not be construed as limiting the scope of the invention:

Example 1: Poly(3-methyl-thiophene)-Coated and Polyaniline-Coated Single-Layer Graphene Mat Electronically conductive polymers by themselves are promising supercapacitor electrode materials because the charge process involves the entire polymer mass and they provide low equivalent series resistance for the electrode. When combined with an NGP-type substrate material, the conducting polymer can impart pseudo-capacitance to the electrode. One desirable conductive polymer selected was poly(3-methyl-thiophene) (pMeT), particularly its p-doped variant. Poly(3-methyl-thiophene) could be synthesized by oxidative chemical polymerization technique using ferric chloride as a dopant in an inert atmosphere. However, we chose to prepare PMeT doped with different anions electrochemically in the presence of tetra-alkyl-ammonium salts using an NGP mat as an electrode. The NGP mat herein used is prepared from mostly single-layer graphene sheets with a mat specific surface area of 1,244 $m^2/g$ (lower than the theoretical value of 2,670 $m^2/g$ due to some inter-graphene overlap). Both atomic force microscopy and TEM studies confirm that most of the NGPs were indeed single-layered.

The specific capacitance of a symmetric supercapacitor containing two electrodes of a NGP mat with no further treatment was found to be 188 F/g, which was increased to 283 F/g with a thin coating of pMeT. (It may be noted that these specific capacitance values were obtained from non-optimized samples.) This was achieved with low-cost NGPs, as opposed to expensive CNT-based materials. A multi-wall CNT/poly(3,4-ethylenedioxythiophene) composite, prepared by chemical or electrochemical polymerization, when evaluated in 1 M $H_2SO_4$, 6 M KOH, or 1 M tetraethylammonium tetrafluoroborate (TEABF4) in acetonitrile, exhibited capacitance values of 60 to 160 F/g. Furthermore, CNT materials are much more expensive.

The polyaniline-NGP sample was synthesized with an in situ chemical oxidative polymerization method. In a typical procedure, 50 mL solution of 1.0 M HCl (37 wt %, Aldrich) containing 15 mg NGPs was sonicated at room temperature for 1 hour. Then, 0.4 mL of aniline monomer was added to the above NGP suspension and sonicated for 0.5 h in an ice bath. Subsequently, 0.4 g of $K_2Cr_2O_7$ in 1.0 M HCl solution was slowly added drop-wise into the well-sonicated suspension with sonication at a reaction temperature of 0-5° C. for 30 min. The dark suspension became green, which indicated the beginning of the polymerization reaction of aniline monomer. Polymerization reaction was carried out at 0-5° C. for 24 h. The composites were obtained by filtering and rinsing the reaction mixtures several times with distilled water and methanol, resulting in the conductive emeraldine salt (ES) form of PANI/NGP composites. Finally, the dark-green composites powders were dried at 60° C. for 24 h under vacuum. The specific capacitance of a symmetric supercapacitor containing two electrodes of a NGP mat with no further treatment was found to be 188 F/g, which was increased to 298 F/g with a thin coating of polyaniline.

Example 2: Polypyrrole-Coated Single-Layer NGPs

Polypyrrole (PPy) and polyaniline can be prepared by electrochemical polymerization with well-controlled growth rates and film thickness. When a pyrrole monomer solution was electrolyzed in the presence of $Et_4N^+BF_4^-$, a blue-black conducting polymer was produced at the anode. This electrode was made of a NGP-based mat using a slurry molding process without a binder polymer. The produced PPy was in the doped state. The specific capacitance of the NGP mat electrode without any further surface treatment was 188 F/g. With a PPy coating, the corresponding value was increased to 303 F/g, indicating a significant pseudo-capacitance effect.

Example 3: NGP-Carbon Black with a Teflon Binder

Carbon black (Black Pearls 2000 from Cabot) and single-layer NGPs (at a ratio of 5:5, 8:2, and 10:0 (pure carbon black)) were mixed and dispersed in deionized water. A Teflon particle suspension was poured into the carbon black-NGP-deionized water slurry and thoroughly stirred. The resulting sludge was dried to a dough and rolled into a Nickel net to form an electrode of 0.2 mm thickness, which was sintered at 320 EC under a pressure of 4 kg/cm². The electrolyte used was 1 M tetra-ethyl-ammonium tetrafluoroborate ($TEABF_4$) in acetonitrile. The specific capacitance of these three samples falls into the range of 120-180 F/g (180 F/g is for the sample with 50% NGPs and 50% CB). However, the sample with the CB/NGP ratio of 5:5 exhibits an electrical conductivity greater than 100 S/cm while the pure CB sample (10:0 ratio) has a conductivity lower than 0.1 S/cm. This implies that the NGP can dramatically reduce the equivalent series resistance of a carbon black or activated carbon-based supercapacitor electrode material. This is an important feature for a good electrode material since a lower resistance could lead to a lower energy loss and faster capacitor response. The maximum power density of a supercapacitor is given by $P_{max}=V_i^2/(4R)$, where $V_i$ is the initial voltage and R the equivalent series resistance (ESR). A lower ESR means a higher power density. Due to their high length-to-thickness and width-to-thickness ratios, NGPs could easily overlap each other to form a continuous electron path for enhanced conductivity. Other fillers that can be incorporated in the nanocomposite include graphitic nanofiber, carbon nanotube, carbon fiber, nano-scaled metal, nano-scaled metal oxide, and combinations thereof.

Example 4: NGP-Carbon Matrix Composite Film and NGP-Based Bucky Paper

Figure 8A:
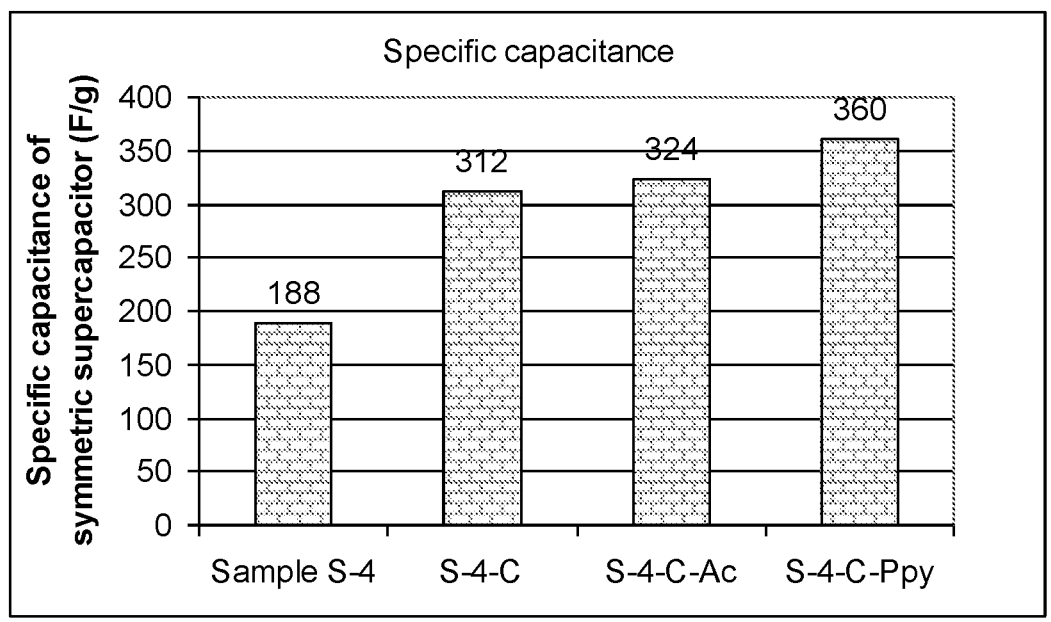
FIG. 8(A) Specific capacitance of four symmetric supercapacitors containing NGP paper electrodes (mostly single-layer graphene), carbon-modified NGP paper electrodes, activated carbon-modified NGP paper electrodes, and Polypyrrole (PPy)-coated carbon-modified NGP paper electrodes.

The same batch of single-layer graphene used in the above three examples was used in Example 4. The performance of supercapacitor electrodes based on NGP-carbon nanocomposite film derived from polyacrylonitrile (PAN) matrix was investigated. A NGP/PAN dispersion was prepared at room temperature by mixing NGPs with a 1.5 g/l dimethylformamide (DMF) solution of poly(acrylonitrile-methyl acrylate) (90:10) (PAN copolymer with Mw=approximately 100,000 g/mol from Aldrich). The weight ratio of NGP to PAN copolymer was 9:1. Solvent casting of the suspension at 85-100 EC resulted in a thin film with a thickness of 26 μm. The film was essentially a Buckypaper. Samples of the film were heat treated at 700 EC in an argon atmosphere for 30 minutes to obtain NGP-carbon matrix nanocomposites (Sample Group S4-C). Several of these samples were subsequently activated in $CO_2$ at 700 EC for 20 minutes in a tube furnace to obtain Sample Group S4-C-AC. Some of Group S4-C material was electrochemically deposited with a thin layer of PPy to obtain Sample Group S4-C-Ppy. The specific capacitance values of several symmetric supercapacitors using a room temperature ionic liquid (1-butyl,3-methylimidazolium chloride) are shown in FIG. 8(A). These data demonstrate that both surface activation and conductive polymer coating are very effective in further enhancing the specific capacitance of NGP Buckypaper or web. Impressive supercapacitance values (e.g., >300 F/g) in a symmetric supercapacitor configuration are readily achievable with the presently invented meso-porous nanocomposites.

Figure 8B:
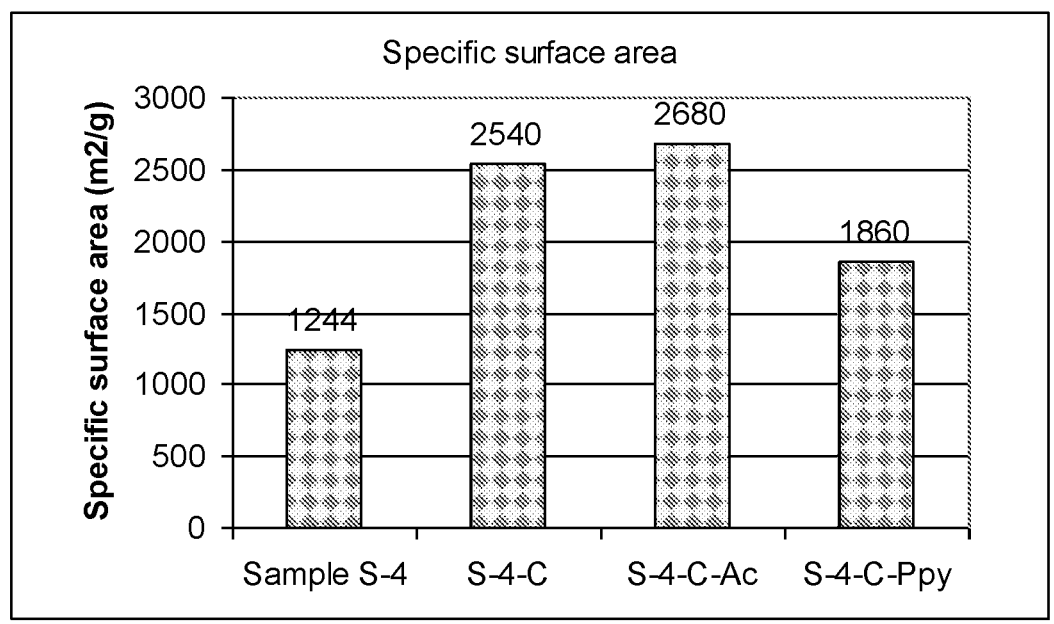
FIG. 8(B) specific surface areas of these four types of electrodes.

FIG. 8(B) shows that the specific surface area of an NGP mat or web can be significantly increased by adding a polymer binder or matrix polymer and then carbonizing this polymer (e.g., an increase from 1,244 m²/g to 2560 m²/g. The precursor polymer can be any polymer with a high carbon yield, such as phenolic-formaldehyde, polyacrylonitrile, and cellulosic polymers. The specific surface area can be further increased by activation. It seems that surface coating by a conducting polymer slightly decreased the specific surface area of an NGP mat, this negative effect was more than compensated for by the attendant pseudo-capacitance effect due to the redox pair between NGP and a conducting polymer.

Example 5: Transition Metal Oxide-Coated NGP Mat

For the preparation of $TiO_2$/NGP electrodes, NGPs were first dispersed in dilute nitric acid (pH 0.5) by ultrasonic agitation. This solution is then transferred to a round bottom flask and titanium tetra-isopropoxide was added drop-wise maintaining the volume ratio of titanium tetra-isopropoxide to water 1:4. The sol obtained was stirred for 2 days in air at room temperature. The obtained turbid suspension was centrifuged at 6,000 rpm and the resultant residue was washed twice with distilled water. As synthesized $TiO_2$/NGP composites were heat treated at 350° C. for 2 h in air. The specific capacitance of the NGP mat (single-layer graphene) in a symmetric supercapacitor configuration was increased from 188 F/g to 267 F/g. Other transition metal oxides, carbides, or sulfides can also be used as a source of pseudo-capacitance.

Example 6: Spacer-Modified NGP Electrodes

A small quantity of NGPs was mixed with water and ultrasonicated at a 60 W power for 10 minutes to obtain a suspension (1% solid content). Nano particles of $TiO_2$ produced in house by a plasma arc process and a small quantity of water-soluble PEO were added to this graphene suspension with a $TiO_2$:PEO:NGP ratio of 5:5:90. The resulting suspension was then cast into a glass substrate, followed by a water removal step. The dried film was then subjected to a heat treatment at 700° C. in a flowing nitrogen environment for one hour to carbonize the polymer. The resulting carbon serves as a conductive binder to bond the $TiO_2$ nano particles to NGP surfaces. The porous mat with $TiO_2$ particles serving as a spacer was used as a supercapacitor electrode.

Example 7: Asymmetric Versus Symmetric Supercapacitors

Figure 9:
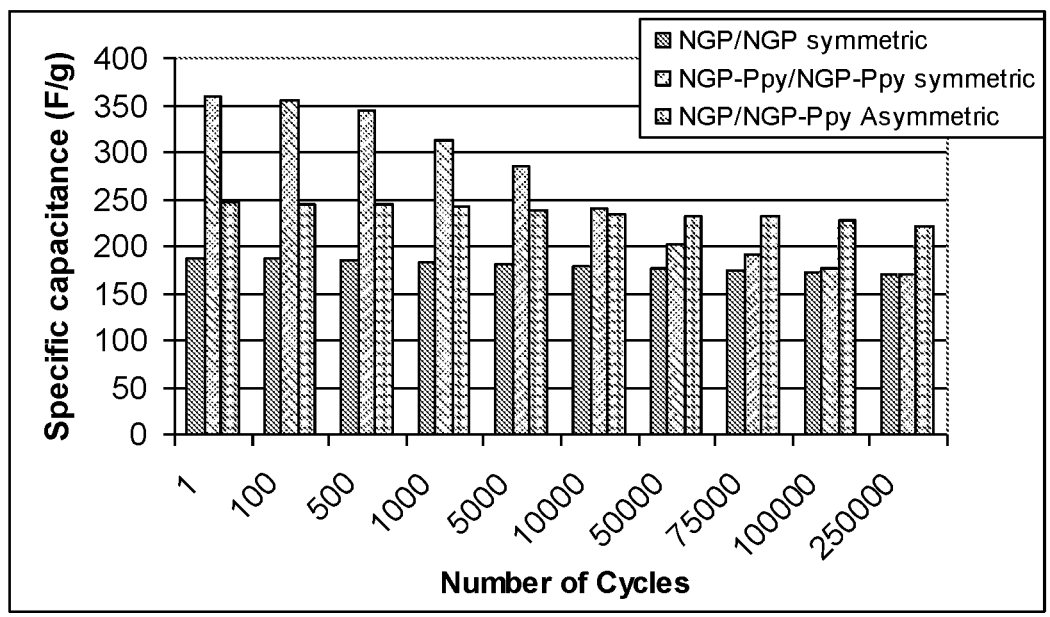
FIG. 9. Charge-discharge cycling responses of three NGP-based supercapacitors (one asymmetric and two symmetric).

Long-term cycling responses of two symmetric supercapacitors and one asymmetric supercapacitor were investigated. Their electrodes were identical to those used in Example 4, but were combined into the following three cells: S4/S4 (symmetric NGP/NGP), S4-C-PPy/S4-C-PPy (symmetric NGP-carbon-PPy electrodes), and S4/S4-C-PPy (asymmetric). The specific capacitance values of these cells are plotted as a function of the number of cycles. There are several surprising observations that are of great interest and direct relevance to the present discussion:

The capacity of the NGP-only supercapacitor (double layer capacitance only, no pseudo-capacitance effect) was very stable, showing very little decay even after 250,000 cycles. In contrast, the symmetric supercapacitor with NGP-PPy electrodes began to decay in capacity after 500 cycles. The capacity decays to a level that is identical to the capacity of NGP-only cell (losing all pseudo-capacitance effect) after 250,000 cycles. Most surprisingly, the asymmetric cell maintains an exceptionally high capacity even after 250,000 cycles, at which the specific capacitance of this asymmetric cell is significantly higher than that of the symmetric cell with all NGP-PPy electrodes. With a working voltage of 3.0 volts, this asymmetric cell provides a cell-level specific energy of >150 Wh/kg, which is comparable to that of a lithium ion battery. This is a major breakthrough in supercapacitor technology, which has never been reported in any supercapacitor based on double layer charges and/or redox pseudo-capacitance effect. This implies that an asymmetric configuration provides a supercapacitor designer with another useful tool to develop supercapacitors with an exceptionally high capacitance and long cycle life. FIG. 9 shows that the specific energy of such an asymmetric supercapacitor can be further increased if a further improved electrolyte is selected. Room temperature ionic liquids with a working voltage higher than 5 volts have been reported in literature. Hence, another embodiment of the present invention is an asymmetric supercapacitor that has a specific energy higher than 30 Wh/kg, preferably higher than 50 Wh/kg, more preferably higher than 100 Wh/kg, and most preferably higher than 200 Wh/kg).

In conclusion, we have successfully developed a new and novel class of electro-chemical cells featuring nano graphene-based electrodes. The asymmetric supercapacitor cells with different NGP-based electrodes exhibit an exceptionally high capacitance, specific energy, and stable and long cycle life. Other desirable features of NGPs include chemical stability and low mass density. They are also of lower costs compared with carbon nano-tube based materials. Both NGPs and NGP-based nanocomposites can be mass-produced cost-effectively.

We claim:

1. A flexible hybrid electrochemical cell comprising:
   (I) a first electrochemical cell comprising:
      (a) a sheet of spacer-modified graphene paper thinner than 1 mm as first electrode, said paper comprising (i) nano graphene platelets having a thickness smaller than 10 nm and (ii) discrete, non-continuous, and non-metallic particles, having a size no less than 2 nm, bonded to a surface or both surfaces of said nano graphene platelets as spacer particles to produce electrolyte-accessible pores having a size greater than 2 nm and less than 10 nm and having a specific surface area greater than 100 $m^2$/g, and (iii) a binder that bonds said nano graphene platelets together and wherein said particles consist of a material selected from the group consisting of metal carbide, metal nitride, metal halide, and combinations thereof; and wherein said first electrode has a first specific capacitance C1,
      (b) a thin-film first separator thinner than 1 mm and electrolyte;
      (c) a thin-film second electrode thinner than 1 mm which is different in composition than the first electrode wherein said second electrode comprises a lithium foil or lithium-intercalated material; and wherein said separator is sandwiched between the first and second electrode to form a flexible laminate configuration;
      (d) a second separator containing electrolyte, wherein said second separator is in physical contact with said second electrode;
      (e) a third thin-film electrode, having a thickness less than 1 mm, in contact with said second separator and having a second specific capacitance C2 and wherein the C1/C2 ratio is greater than 3 which is used as a supercapacitor; and
   (II) a second energy storage or conversion cell in a working relation to said first electrochemical cell, wherein said energy storage or conversion cell is selected from a battery, a fuel cell, a photovoltaic or solar cell, or a combination thereof.

2. The flexible hybrid electrochemical cell of claim 1 further comprising a third electrochemical cell in a working relation to said first electrochemical cell or said second energy storage or conversion cell.

3. A flexible hybrid electrochemical cell comprising:
   (I) a first electrochemical cell comprising:
      (a) a sheet of graphene paper as first electrode comprising nano graphene platelets having a platelet thickness less than 1 nm, wherein said first electrode has electrolyte-accessible pores, wherein said first electrode comprises a transition metal carbide coated on or bonded to at least one of the nano graphene platelets;
 (b) a thin-film first separator thinner than 1 mm and electrolyte; and
 (c) a thin-film or paper-like second electrode thinner than 1 mm which is different in composition than the first electrode; wherein said second electrode comprises a lithium foil or lithium-intercalated material; and wherein said separator is sandwiched between the first and second electrode to form a flexible laminate configuration; and (II) a second energy storage or conversion cell in a working relation to said first electrochemical cell, wherein said energy storage or conversion cell is selected from a battery, a fuel cell, a photovoltaic or solar cell, or a combination thereof.

4. The flexible hybrid electrochemical cell of claim 3 further comprising a third electrochemical cell in a working relation to said first electrochemical cell or said second energy storage or conversion cell.

5. A flexible hybrid electrochemical cell comprising:
I. a first electrochemical capacitor comprising:
 (a) a spacer-modified first thin-film electrode having a thickness lower than 1 mm, comprising (i) nano graphene platelets having a thickness smaller than 1 nm; (ii) discrete, non-continuous, and non-metallic particles having a size no less than 2 nm and selected from the group consisting of metal carbides, metal nitrides, metal halides, and combinations thereof, and wherein said particles are bonded to a surface or both surfaces of said nano graphene platelets to produce electrolyte-accessible pores having a size greater than 2 nm but less than 10 nm; and (iii) a binder that bonds said nano graphene platelets together, and wherein said first electrode has a specific surface area greater than about 100 $m^2/g$ and a first specific capacitance C1;
 (b) a second thin-film electrode having a thickness lower than 1 mm, comprising nano graphene platelets and a plurality of interconnected pores accessible by an electrolyte, and wherein said second electrode has a specific surface area greater than about 100 $m^2/g$ and a second specific capacitance C2 and wherein the C1/C2 ratio is greater than 3; and
 (c) a thin-film or porous electrode separator having a thickness lower than 0.1 mm disposed between the first and second electrodes, said separator comprising said electrolyte; and
II. a second energy storage or conversion cell in a working relation to said first electrochemical capacitor, wherein said energy storage or conversion cell is selected from a battery, a fuel cell, a photovoltaic or solar cell, or a combination thereof.

6. The flexible hybrid electrochemical cell of claim 5 further comprising a third electrochemical cell in a working relation to said first electrochemical capacitor or said second energy storage or conversion cell.

7. The flexible hybrid electrochemical cell of claim 5, wherein said electrolyte comprises a room temperature ionic liquid.

8. The flexible hybrid electrochemical cell of claim 5, wherein said first electrode further comprises fibrous elements selected from the group consisting of carbon nano-fibers, graphitic nano-fibers, carbon nano-tubes, carbon-graphite fibers, cellulose fibers, glass fibers, polymer fibers, ceramic fibers, metal fibers, and combinations thereof.

9. A flexible hybrid electrochemical cell comprising:
I. a flexible electrochemical capacitor or supercapacitor, comprising:
 (a) a first paper-like electrode, comprising nano graphene platelets and a plurality of pores accessible by an electrolyte wherein said first electrode has a specific surface area greater than about 100 $m^2/g$, wherein said first electrode comprises a transition metal carbide coated on or bonded to at least one of the nano graphene platelets;
 (b) a second paper-like electrode, comprising nano graphene platelets and a plurality of pores accessible by said electrolyte wherein said second electrode has a specific surface area greater than about 100 $m^2/g$; and
 (c) a paper-like or porous electrode separator disposed between the first and second electrodes, said separator comprising said electrolyte; and
II. a second energy storage or conversion cell in a working relation to said first electrochemical capacitor, wherein said energy storage or conversion cell is selected from a battery, a fuel cell, a photovoltaic or solar cell, or a combination thereof.

* * * * *